United States Patent
Yamamoto et al.

(10) Patent No.: US 8,754,502 B2
(45) Date of Patent: Jun. 17, 2014

(54) PHOTODIODE ARRAY

(71) Applicant: Hamamatsu Photonics K.K., Hamamatsu (JP)

(72) Inventors: Koei Yamamoto, Hamamatsu (JP); Terumasa Nagano, Hamamatsu (JP); Kazuhisa Yamamura, Hamamatsu (JP); Kenichi Sato, Hamamatsu (JP); Ryutaro Tsuchiya, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/710,845

(22) Filed: Dec. 11, 2012

(65) Prior Publication Data

US 2014/0117484 A1    May 1, 2014

(30) Foreign Application Priority Data

Oct. 29, 2012 (JP) ................. 2012-238337

(51) Int. Cl.
*H01L 29/861* (2006.01)
*H01L 21/20* (2006.01)

(52) U.S. Cl.
USPC .......................... 257/603; 438/91; 438/380

(58) Field of Classification Search
USPC ............... 257/186, 199, 438, 481, 551, 603; 438/91, 380
See application file for complete search history.

(56) References Cited

U.S. PATENT DOCUMENTS

| | | | |
|---|---|---|---|
| 8,482,092 B2 * | 7/2013 | Lee et al. | 257/438 |
| 2006/0175529 A1 | 8/2006 | Harmon et al. | |
| 2012/0153420 A1 * | 6/2012 | Lee et al. | 257/432 |
| 2013/0270666 A1 * | 10/2013 | Sato et al. | 257/438 |

FOREIGN PATENT DOCUMENTS

EP    1755171 A1    2/2007

* cited by examiner

*Primary Examiner* — Calvin Lee
(74) *Attorney, Agent, or Firm* — Drinker Biddle & Reath LLP

(57) ABSTRACT

Each light detecting unit includes a semiconductor region that outputs a carrier, and a surface electrode. In a photodiode array, a read wire is positioned between neighboring avalanche photodiodes. When a plane including a surface of the semiconductor region is set as a reference plane, a distance tb from the reference plane to the read wire is larger than a distance ta from the reference plane to the surface electrode.

4 Claims, 31 Drawing Sheets

*Fig.2*
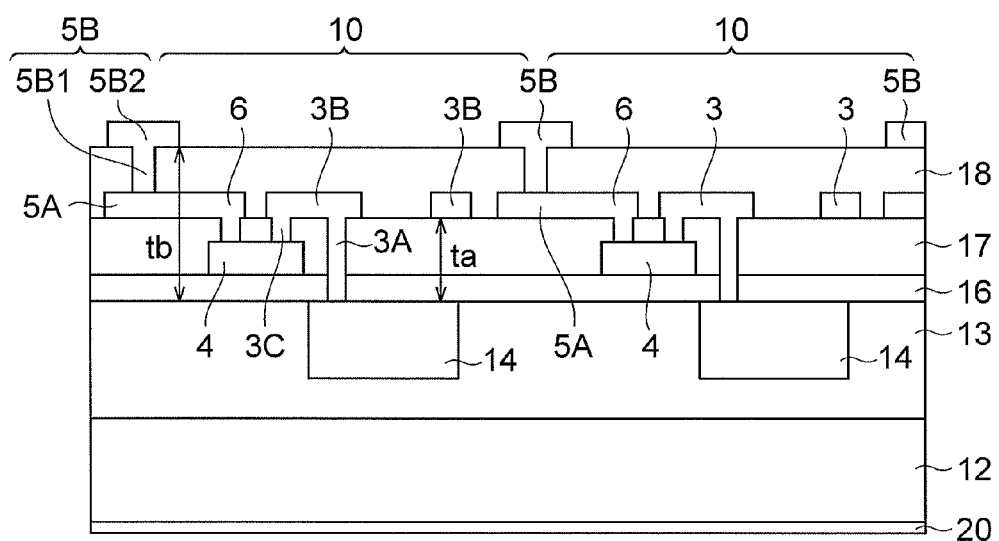
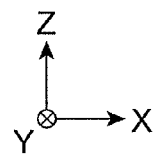

Fig.20
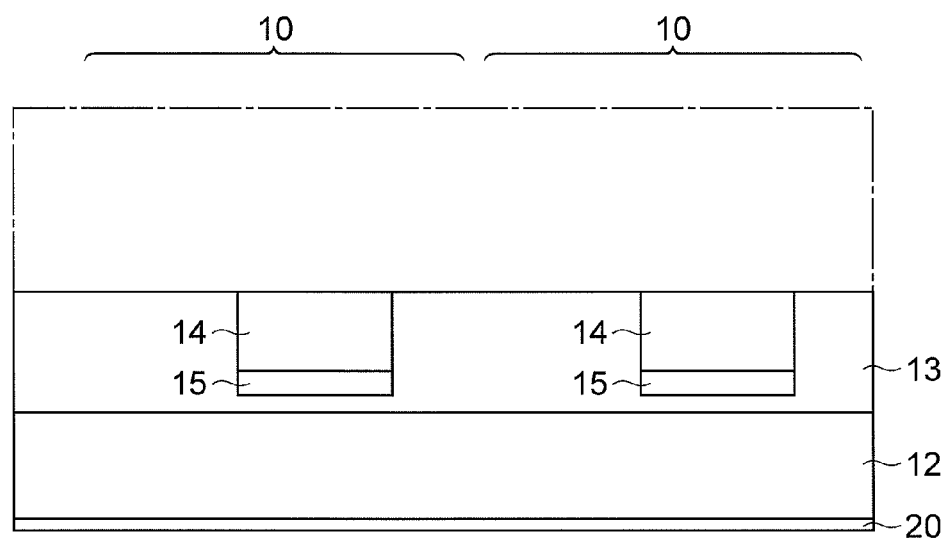
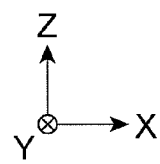

PHOTODIODE ARRAY

TECHNICAL FIELD

The present invention relates to a photodiode array.

BACKGROUND

Conventional photodiode arrays are disclosed in Patent Literatures 1 and 2, for example. A photodiode array, such as SiPM (Silicon Photo Multiplier) or PPD (Pixelated Photon Detector), has a structure in which APDs (avalanche photodiodes) are arranged in a matrix shape, a plurality of APDs are connected in parallel, and a sum of outputs of the APD is read. When an APD is operated in the Geiger mode, a feeble light (photon) can be detected. That is, when a photon enters the APD, a carrier generated in the APD is output to the outside through a quenching resistor and a wiring pattern for reading a signal. Although electric current flows through a pixel in which an electron avalanche in an APD has occurred, a voltage drop occurs through a quenching resistor of about hundreds kΩ sequentially connected to the pixel. This voltage drop lowers the voltage applied to an amplification region of the APD, which terminates a multiplication effect by the electron avalanche. In this manner, one pulse signal is output from an APD in response to an incidence of one photon.

Patent Literature 1: European Patent Application Publication No. 1755171

Patent Literature 2: U.S. Patent Application Publication No. 2006/175529

SUMMARY

However, in the prior art, although a signal is output from an APD through a read wire connected to a quenching resistor, and the signal read speed was not sufficient. The present invention has been accomplished in view of the above problems, and the object of the invention is to provide a photodiode array capable of enhancing the characteristics, such as the signal read speed.

In order to solve the problems described above, a photodiode array according to an aspect of the present invention is a photodiode array including a plurality of light detecting units having avalanche photodiodes operating in the Geiger mode. Each of the light detecting units includes an avalanche photodiode having a semiconductor region that outputs a carrier, a surface electrode that is electrically connected to the semiconductor region and surrounds the semiconductor region along an outer edge thereof, and a quenching resistor that connects the surface electrode and a read wire with each other. When a plane including a surface of the semiconductor region is set as a reference plane, a distance from the reference plane to the read wire is larger than a distance from the reference plane to the surface electrode, and the read wire is positioned between neighboring avalanche photodiodes.

A carrier generated in response to the incidence of the light to a semiconductor region reaches an electrode pad sequentially through the surface electrode, the quenching resistor, and the read wire. Since the read wire is formed on a layer higher than the surface electrode, the spatial restriction due to the surface electrode is removed, so as to allow the width of the read wire or the like to be increased. As a result, it is possible to decrease the time constant, and thereby increase the signal read speed.

Further, when the photodiode array described above is seen in a direction perpendicular to the reference plane, the read wire overlaps with a part of the surface electrode.

In this case, since the region in which the read wire is formed uses a region on the surface electrode, which corresponds to a dead space with respect to the light incidence, it is possible to increase the dimensions of the read wire without decreasing the fill factor of the photodiode, and thereby decrease the resistance value.

Further, the photodiode array includes a first insulating layer formed on the quenching resistor, a supplementary read wire electrically connected to the quenching resistor through a contact hole formed through the first insulating layer, and a second insulating layer formed on the supplementary read wire. The read wire is electrically connected to the supplementary read wire through a contact hole formed through the second insulating layer, extends in parallel to the supplementary read wire, and is connected to the electrode pad, together with the supplementary read wire.

A resistance value from the photodiode to the electrode pad can be reduced by using two read wires.

Further, the photodiode array described above includes an insulating layer formed on the quenching resistor. The read wire is electrically connected to the quenching resistor through a contact hole formed through the insulating layer and electrically connects the quenching resistor and an electrode pad with each other.

It is possible to increase the design freedom of the read wire and decrease the time constant, thereby increasing the signal read speed.

A photodiode array according to an aspect of the present invention can enhance the characteristics, such as the signal read speed.

BRIEF DESCRIPTION OF THE DRAWINGS

FIG. 2 is a cross-sectional view of the photodiode array;

FIG. 3 is a diagram illustrating a connection relation among electrodes, wires, and the like;

FIG. 4 is a diagram illustrating a connection relation among electrodes, wires, and the like;

FIG. 11 is a view illustrating connection relations among electrodes, wires, and the like;

FIG. 20 is a longitudinal sectional view of a photodiode array having a changed substrate structure;

DESCRIPTION OF EMBODIMENTS

Figure 1:
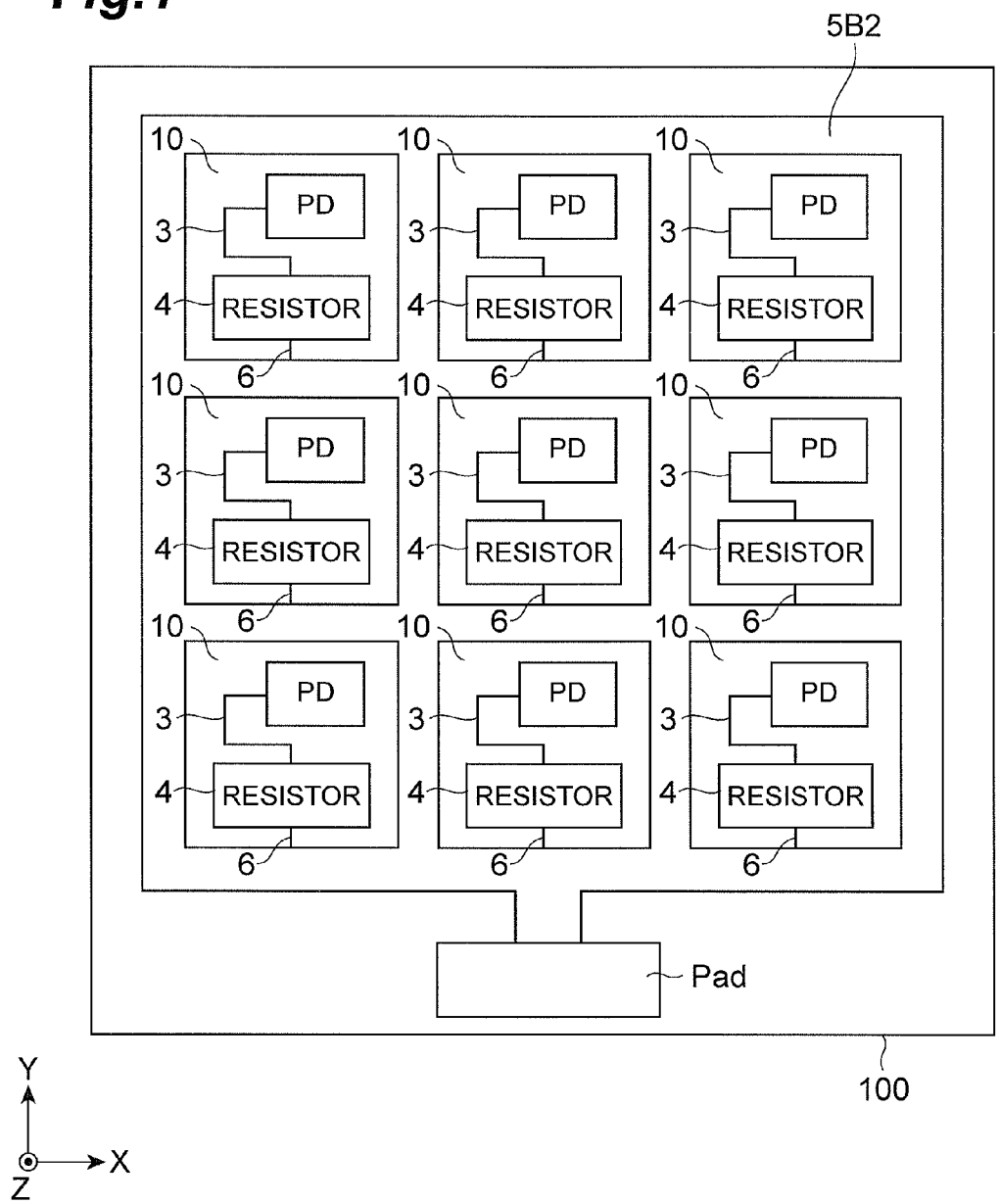
FIG. 1 is a plan view of a photodiode array.

Hereinafter, a photodiode array according to an embodiment is described. Further, the same reference numeral is used to indicate the same element, and a repetitive description of the same element is omitted.

FIG. 1 is a plan view of a photodiode array.

The photodiode array includes a semiconductor substrate 100 having a plurality of light detecting units 10. The photodiode array includes light receiving areas formed by arranging the light detecting units 10 in two dimensions, and an electrode pad "Pad" provided outside the light receiving areas in the semiconductor substrate 100. A signal from each photodiode PD is read through the electrode pad "Pad". This type of photodiode PD is an avalanche photodiode (APD) operating in the Geiger mode. In the drawing, the light detecting units 10 are arranged in a matrix shape along the X-axis direction and the Y-axis direction. The thickness direction of the semiconductor substrate 100 is the Z-axis direction and the XYZ axes configure an orthogonal coordinate system. Further, in FIG. 1, 3 columns and 3 rows of light detecting units 10 are arranged and configure the light receiving areas. However, the number of the light detecting units 10 may be either larger or smaller. Further, the light detecting units 10 may be arranged in one dimension.

Each of the light detecting units 10 includes a photodiode PD, a connection electrode 3, a quenching resistor 4, and a connection wire 6. One end of the photodiode PD is connected to the connection electrode 3, and the connection electrode 3 is connected to a read wire (wiring pattern) 5B2 through the quenching resistor 4 and the connection wire 6 in sequence. The read wire 5B2 is positioned between neighboring photodiodes PD and exists in the boundary position between the light detecting units 10.

The read wire 5B2 forms a lattice-shaped pattern, wherein one light detecting unit 10 is positioned in one opening of the pattern. The read wire 5B2 may employ patterns with various shapes. A plurality of light detecting units 10 may be arranged in one opening of the pattern of the read wire 5B2. Otherwise, one row or a plurality of rows of light detecting units 10 may be arranged in one opening of the pattern.

If a photon enters one light detecting unit 10, a carrier is generated in the photodiode PD, and the carrier then reaches the electrode pad "Pad" after sequentially passing through the connection electrode 3, the quenching resistor 4, the connection wire 6, and the read wire 5B2 (connection wire 5B). Accordingly, whenever a photon enters the photodiode array, a pulse signal is output from the electrode pad "Pad". Further, when photons respectively enter a plurality of photodiodes PD at the same time, a signal from a photodiode PD existing at a position far from the electrode pad "Pad" reaches the electrode pad "Pad" later than a signal from a photodiode PD existing at a position near to the electrode pad "Pad". That is, the signal transfer time differs depending on the positions of the photodiodes PD.

It can be said that, the shorter the signal transfer time from each photodiode PD, the smaller the in-plane dispersion of the signal transfer time, and the larger the output signal in a photodiode array, the better the features of the photodiode array. The former two features can be enhanced by decreasing the time constant in a signal transfer path. This is because decreasing of the time constant can increase the signal transfer speed and decrease the differential between photodiodes. If the width of the read wire is increased, the time constant is decreased. Meanwhile, the latter feature can be enhanced by increasing the fill factor in each of the photodiodes. However, it is general that an increase in the width of the read wire decreases the fill factor. Accordingly, the photodiode array of the present aspect employs a structure in which the read wire 5B2 is positioned at a layer higher than a surface electrode 3B, which is a main part of the connection electrode 3, so that the fill factor is not decreased in spite of an increased width of the read wire.

Figure 3:
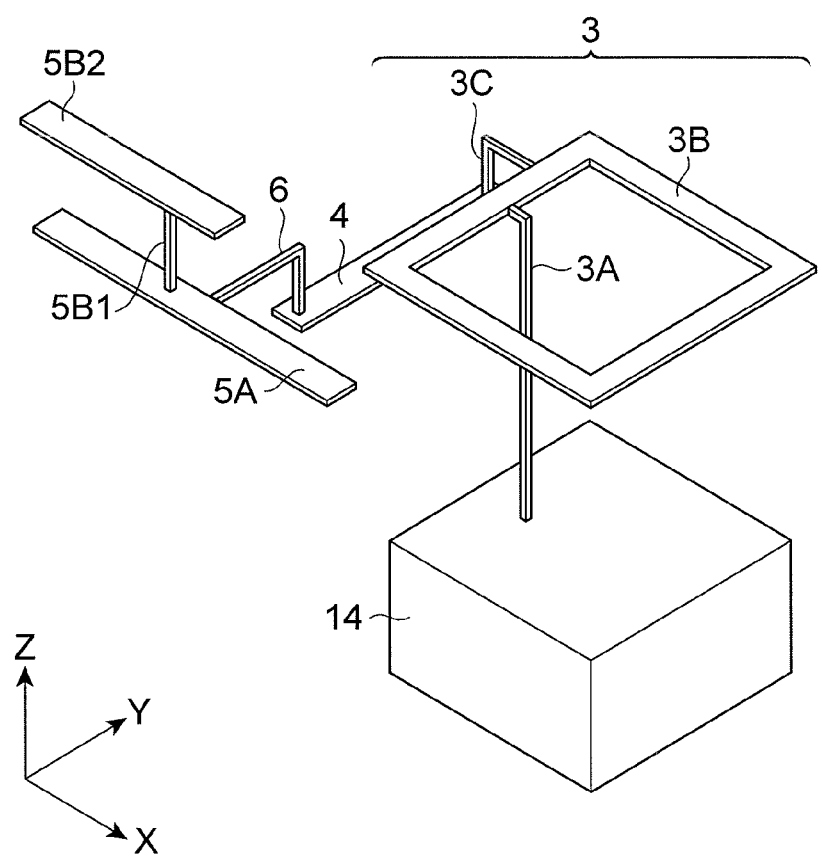

FIG. 2 is a cross-sectional view of a photodiode array, and FIG. 3 is a diagram illustrating a connection relation among electrodes, wires, and the like.

As illustrated in FIG. 2, each of the light detecting units 10 includes a first semiconductor region (layer) 12 of a first conductivity type (n-type), and a second semiconductor region (including a semiconductor layer 13 and a high-concentration impurity region 14) of a second conductivity type (p-type), which forms a pn junction with the first semiconductor region 12. The first semiconductor region 12 and the second semiconductor region form a semiconductor substrate. The semiconductor region 14 or the region just below the semiconductor region 14 functions as a photosensitive region, and outputs a carrier, since a carrier is generated by the pn junction therein. If a potential lower than a potential of the n-type semiconductor is applied to the p-type semiconductor, a reverse bias voltage is applied to the photodiode. Relatively, a carrier attracted by a negative potential corresponds to a hole while a carrier attracted by a positive potential corresponds to an electron. When a reverse bias voltage is higher than a breakdown voltage of an APD, the APD operates in the Geiger mode. The bias voltage is applied between the electrode pad "Pad" and a back side electrode 20 which is provided over an entire back side of the semiconductor substrate (first semiconductor region 12).

A first contact electrode 3A (see FIG. 3) is in contact with the high-concentration impurity region (semiconductor region) 14 in the second semiconductor region. The high-concentration impurity region 14 is a diffusion region (semiconductor region) formed by diffusing impurities into the semiconductor layer 13, and has an impurity concentration higher than that of the semiconductor layer 13. According to the present example (Type 1), the semiconductor layer 13 of the p-type is formed on the first semiconductor region 12 of the n-type, and the high concentration impurity region 14 of the p-type is formed at the surface side of the semiconductor layer 13. Therefore, the pn junction configuring the photodiode is formed between the first semiconductor region 12 and the semiconductor layer 13.

Further, a structure with conductivity types reverse to the conductivity types of the structure described above may be employed as a layer structure of the semiconductor substrate. That is, a structure of Type 2 may be formed by forming a semiconductor layer 13 of an n-type on a first semiconductor region 12 of a p-type and then forming a high concentration impurity region 14 of an n-type at the surface side of the semiconductor layer 13.

Further, the pn junction interface may be formed at a surface layer side. In this case, a structure of Type 3 is a structure in which a semiconductor layer 13 of an n-type is formed on a first semiconductor region 12 of an n-type and a high concentration impurity region 14 of a p-type is formed at the surface side of the semiconductor layer 13. Further, this structure has a pn junction formed at an interface between the semiconductor layer 13 and the semiconductor regions 14.

Of course, in this structure also, the conductivity types may be reversed. That is, a structure of Type 4 is a structure in which a semiconductor layer 13 of a p-type is formed on a first semiconductor region 12 of a p-type and a high concentration impurity region 14 of an n-type is formed at the surface side of the semiconductor layer 13.

As illustrated in FIG. 3, a first contact electrode 3A is in contact with the semiconductor region 14, an annular electrode 3B is formed successively to the first contact electrode, and the annular electrode 3B is connected to a quenching resistor (resistive layer) 4 through a second contact electrode 3C. That is, the connection electrode 3 including the first contact electrode 3A, the annular surface electrode 3B, and the second contact electrode 3C is electrically connected to the semiconductor region 14 and one end of the quenching resistor 4.

As illustrated in FIG. 2, a first insulating layer 16 is formed on the semiconductor region 13 and 14 and a quenching resistor 4 is formed on the first insulating layer 16. A second insulating layer 17 is formed to cover the quenching resistor 4 and the first insulating layer 16. A contact hole through which the first contact electrode 3A (FIG. 3) passes is formed through the first second and insulating layers 16 and 17 and a contact hole through which the second contact electrode 3C (FIG. 3) passes is formed through the second insulating layer 17. Further, the connection wire 6 is in contact with and is electrically connected to the other end of the quenching resistor 4. The connection wire 6 includes a contact electrode extending through the contact hole formed through the second insulating layer 17 and a connecting part extending on the second insulating layer 17, and the connecting part is formed successively to a supplementary read wire (lower layer read wire) 5A.

Further, a third insulating layer 18 is formed on the supplementary read wire 5A, the surface electrode 3B, and the second insulating layer. The first to third insulating layers 16, 17, and 18 are formed of an inorganic insulator with a high heat resistance, such as $SiO_2$ or silicon nitride (SiNx). The read wire 5B2 is formed on the third insulating layer 18. As illustrated in FIG. 3, the connection wire 5B includes a contact electrode 5B1 passing through a contact hole formed through the third insulating layer 18, and the read wire 5B2 which is formed successively to the contact electrode 5B1 and is positioned on the third insulating layer 18. In the example illustrated in FIG. 3, the supplementary read wire 5A and the read wire 5B2 are spaced apart from each other in the thickness direction and are arranged in parallel to each other, and terminals of them are electrically connected to the electrode pad "Pad".

The electrode pad "Pad" is formed on the second insulating layer 17 or the third insulating layer 18 in FIG. 2 (not illustrated). In regard to the terminal of the read wire 5B2, when the electrode pad "Pad" is formed on the second insulating layer 17, the electrode pad "Pad" is positioned on the region in which the third insulating layer 18 is removed and the supplementary read wire 5A and the read wire 5B2 are connected to the electrode pad. In regard to the terminal of the supplementary read wire 5A, when the electrode pad "Pad" is formed on the third insulating layer 18, the read wire 5B2 is connected to the electrode pad "Pad" and the supplementary read wire 5A is connected to the electrode pad "Pad" through the contact hole formed through the third insulating layer 18.

The annular surface electrode 3B is disposed on the second insulating layer 17 and is disposed along an outer edge of the semiconductor region 14 in view of the Z-axis direction. The surface electrode 3B improves the stability of the photodiode output by generating a constant electric field on the outer edge of the semiconductor region 14 (the boundary between the semiconductor region 13 and the semiconductor region 14).

Here, when a plane including the surface of the semiconductor region 14 in FIG. 2 is set as a reference plane (XY plane), a distance tb from the reference plane to the read wire 5B2 is larger than a distance to from the reference plane to the surface electrode 3B. This is because the third insulating layer 18 is interposed between the read wire 5B2 and the second insulating layer 17. By this structure, the freedom of design with respect to the width of the read wire 5B2 can be increased without reducing the fill factor of the photodiode. As a result, it is possible to increase the width of the read wire 5B2, decrease a resistance value per unit length, decrease the parasitic capacitance, and increase the signal transfer speed.

Further, the photodiodes PD are configured by a semiconductor region 14 and a region right below the semiconductor region 14, and includes the semiconductor regions 13 and 12. The read wire 5B2 is formed between the semiconductor regions 14 (photodiodes PD). An increase in the width of the read wire 5B2 can increase the signal output, since such an increase does not lower the fill factor before the increased width covers the exposed area of the semiconductor region 14.

As described above, in the photodiode array described above, which includes a plurality of light detecting units 10 having avalanche photodiodes that operate in the Geiger mode, each of the light detecting units 10 includes an avalanche photodiode PD having a semiconductor region 14 for outputting a carrier, a surface electrode 3B that is electrically connected to the semiconductor region 14 and surrounds the semiconductor region 14 along the outer edge thereof, and a quenching resistor 4 that connects the surface electrode 3B and the read wire 5B2 with each other. Further, when a plane including the surface of the semiconductor region 14 is set as a reference plane, the distance tb from the reference plane to the read wire 5B2 is larger than the distance to from the reference plane to the surface electrode 3B, and the read wire 5B2 is disposed between neighboring avalanche photodiodes PD. This photodiode array can enhance the characteristics of the signal read speed and the like.

Further, in the above embodiments, an annular electrode is used as the surface electrode 3B. However, a part of the annular surface electrode 3B may be cut off. Moreover, although the quenching resistor 4 has a linearly extending shape in the above embodiments, it may have various shapes.

Figure 4:
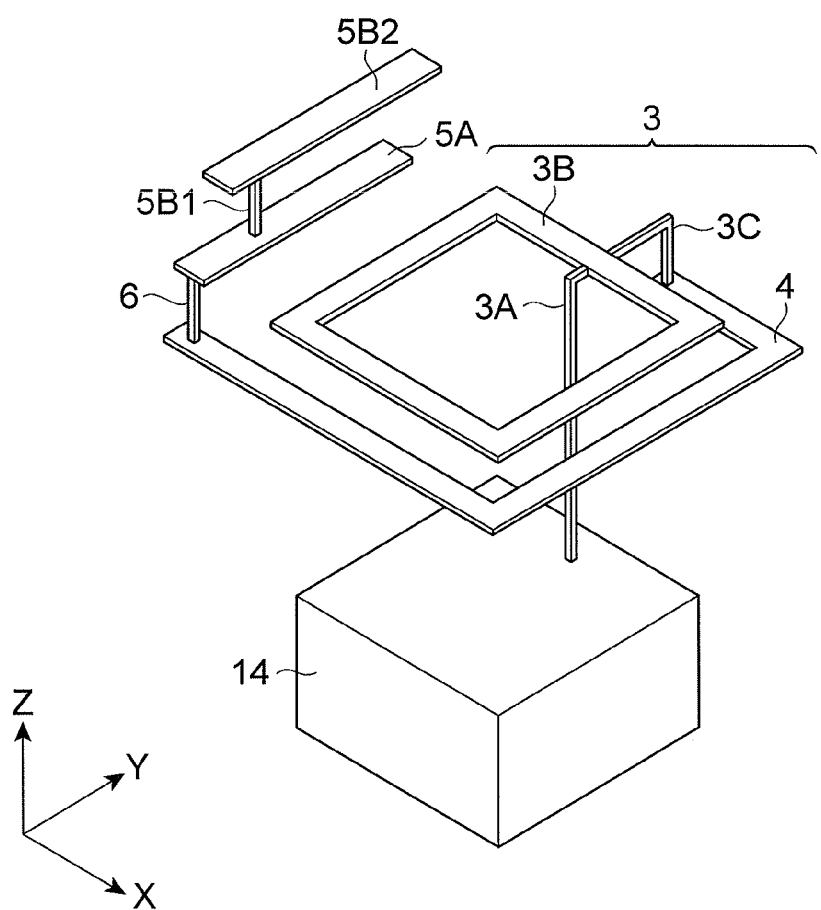

FIG. 4 is a diagram illustrating a connection relation among electrodes, wires, and the like.

A quenching resistor 4 according to the present example extends so as to surround the outside of a surface electrode 3B, and has a shape of a partly cut-out ring. One end of the quenching resistor 4 is electrically connected to a semiconductor region 14 through a connection electrode 3. The other end of the quenching resistor 4 is connected to a supplementary read wire 5A through a connection wire 6, and a supplementary read wire 5A is electrically connected to a read wire 5B2 through a contact electrode 5B1. In the present example, the quenching resistor 4 is long, which means that the present example has a structure capable of increasing the resistance value of the quenching resistor. However, the structure of the longitudinal section thereof taken along the carrier passage route is nearly the same as that illustrated in FIG. 2, except that the connection wire 6 does not have a horizontally extending part and is directly connected to the lower surface of the supplementary read wire 5A.

Next, various examples of structures of the read wire 5B and the supplementary read wire 5A will be described.

First Example

Figure 5:
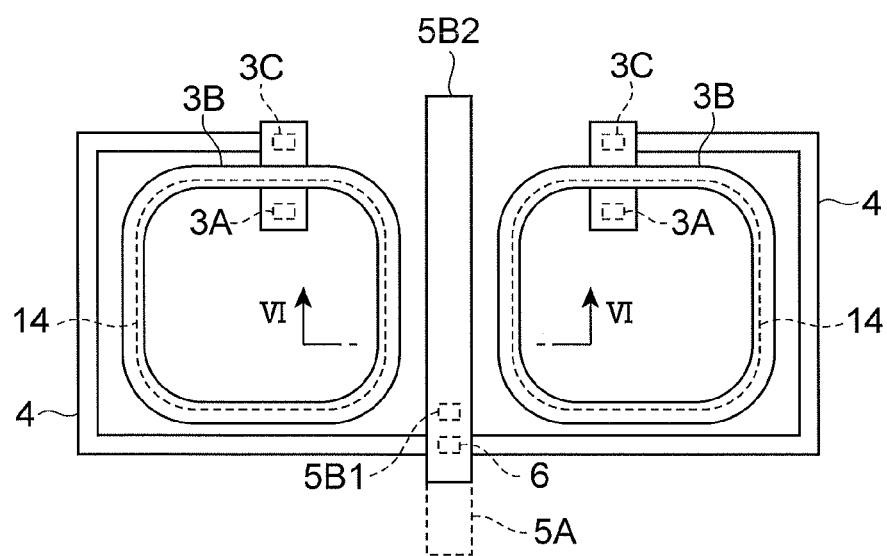
FIG. 5 is a partial plan view of a photodiode array (first example)
Figure 6:
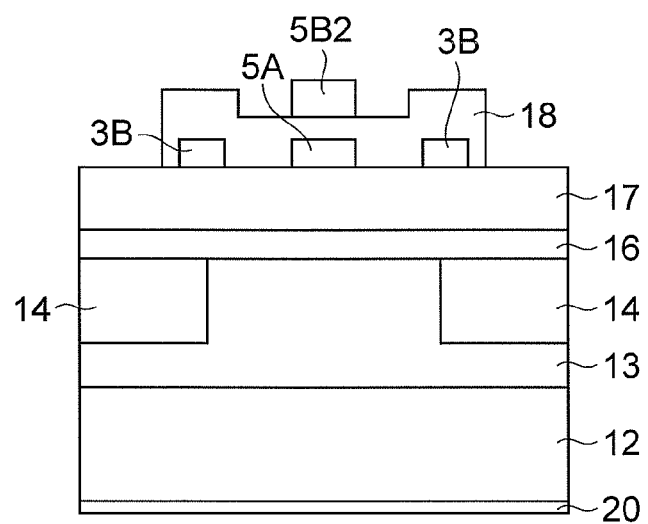
FIG. 6 is a cross-sectional view taken along line VI-VI of the photodiode array (first example) illustrated in FIG. 5.

FIG. 5 is a partial plan view of a photodiode array (first example), and FIG. 6 is a cross-sectional view taken along line VI-VI of the photodiode array (first example) illustrated in FIG. 5.

The structure of the first example corresponds to a case in which a read wire 5B2 extends between neighboring semiconductor regions 14 and a width of the read wire 5B2 is smaller than the spaced distance between neighboring surface electrodes 3B, in the structure illustrated in FIG. 4. Also, a supplementary read wire 5A has the same width as that of the read wire 5B2 and these extend in parallel to each other. Here, when the thickness of a third insulating layer 18 is not sufficiently large, or when the third insulating layer 18 has not been subjected to a surface polishing, the surface of the third insulating layer 18 may have concave and convex parts due to the shape of the surface electrode 3B under the third insulating layer 18, as illustrated in FIG. 6. Of course, the shape of the supplementary read wire 5A may also deform the surface of the third insulating layer 18 to make it have concave and convex parts, although such deformation is not illustrated in FIG. 6.

In the present example, since the two read wires 5A and 5B2 are disposed in parallel to each other, it is possible to decrease the wiring resistance and decrease the time constant, thereby increasing the signal read speed.

Second Example

Figure 7:
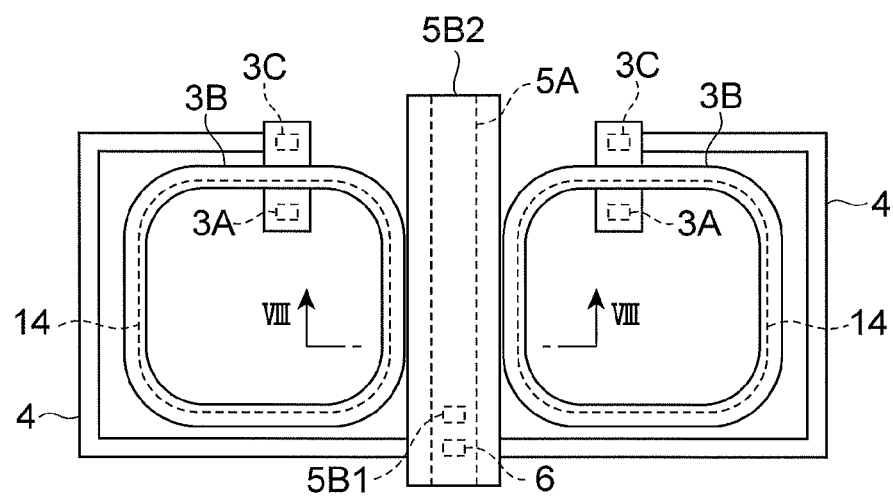
FIG. 7 is a partial plan view of a photodiode array (second example)
Figure 8:
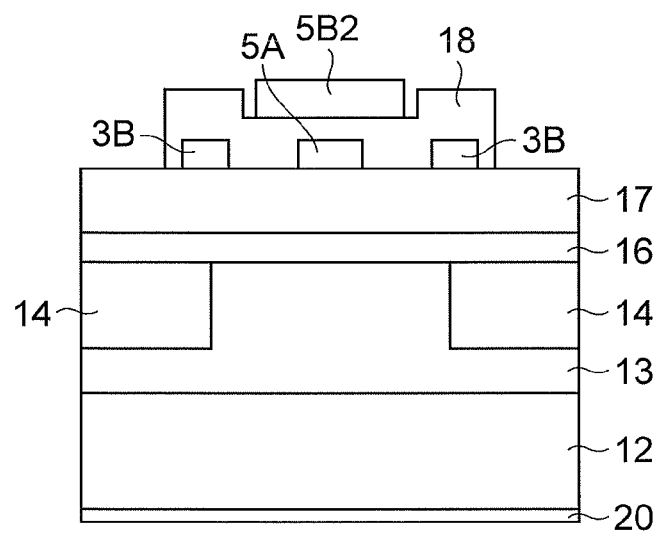
FIG. 8 is a cross-sectional view taken along line VIII-VIII of the photodiode array (second example) illustrated in FIG. 7.

FIG. 7 is a partial plan view of a photodiode array (second example), and FIG. 8 is a cross-sectional view taken along line VIII-VIII of the photodiode array (second example) illustrated in FIG. 7.

The structure of the second example corresponds to a case in which a read wire 5B2 extends between neighboring semiconductor regions 14 and the width of the read wire 5B2 is similar to the spaced distance between neighboring surface electrodes 3B, in the structure illustrated in FIG. 4. Further, a supplementary read wire 5A has a width narrower than that of the read wire 5B2 and they extend in parallel to each other. Here, when the thickness of the third insulating layer 18 is not sufficiently large, or when a surface polishing is not performed for the third insulating layer 18, the surface of the third insulating layer 18 may have concave and convex parts due to the shape of the surface electrode 3B under the third insulating layer 18, as illustrated in FIG. 8. Of course, the shape of the supplementary read wire 5A may also deform the surface of the third insulating layer 18 to make it have concave and convex parts, although such deformation is not illustrated in FIG. 8.

In the present example, since the two read wires 5A and 5B2 are disposed in parallel to each other, it is possible to increase the wiring resistance and decrease the time constant, thereby increasing the signal read speed. Further, since the width of the read wire 5B2 is large, the wiring resistance can be greatly decreased.

Further, in the first and second examples described above, if the thickness of the third insulating layer 18 is sufficiently large (1 to 5 μm), or if the surface has been polished flattened by polishing, the read wire 5B is formed on a smooth surface, so that there is an effect in that an occurrence of disconnection caused by the step on the surface is suppressed. Further, both thicknesses of the surface electrode 3B and the supplementary read wire 5A have a value between 0.6 to 3.0 μm.

Third Example

Figure 9:
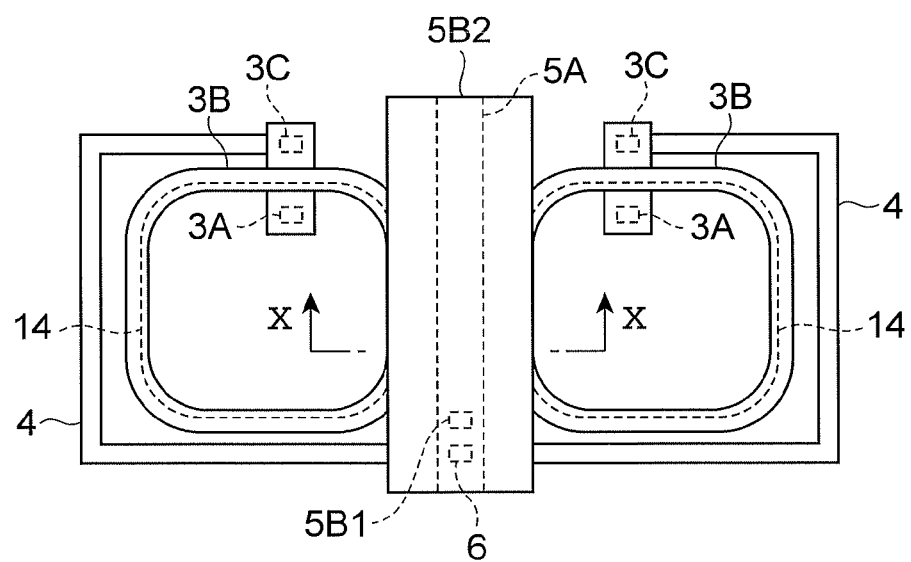
FIG. 9 is a partial plan view of a photodiode array (third example)
Figure 10:
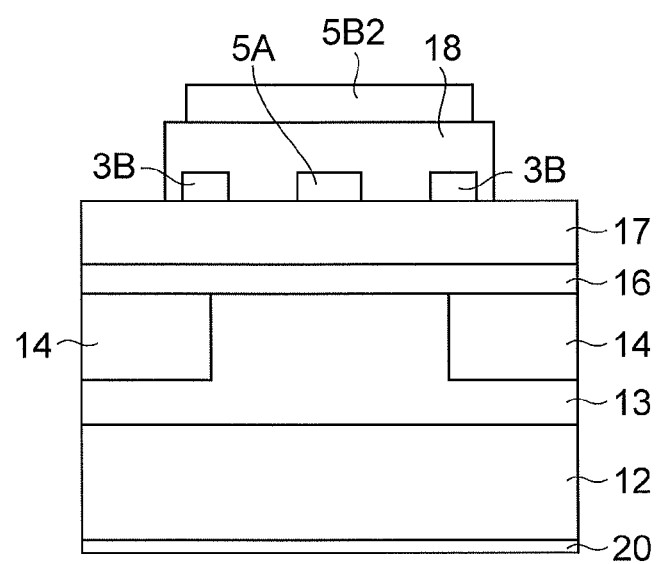
FIG. 10 is a cross-sectional view taken along line X-X of the photodiode array (third example) illustrated in FIG. 9.

FIG. 9 is a partial plan view of a photodiode array (third example), and FIG. 10 is a cross-sectional view taken along line X-X of the photodiode array (third example) illustrated in FIG. 9.

The structure of the third example corresponds to a case in which the read wire 5B2 extends between neighboring semiconductor regions 14 and the width of the read wire 5B2 is longer than the spaced distance (the minimum value among the spaced distances between the outer edges) between neighboring surface electrodes 3B, in the structure illustrated in FIG. 4. The width of the read wire 5B2 is equal to or smaller than the minimum spaced distance value between the inner edges of the neighboring surface electrodes 3B.

Further, a supplementary read wire 5A has a width narrower than that of the read wire 5B2, and they extend in parallel to each other. Here, since the thickness of the third insulating layer 18 is sufficiently large or the third insulating layer 18 has been subjected to a surface polishing, the surface of the third insulating layer 18 is flattened as illustrated in FIG. 10.

In the present example, since the two read wires 5A and 5B2 are disposed in parallel to each other, it is possible to decrease the wiring resistance and decrease the time constant, thereby increasing the signal read speed. Further, since the width of the read wire 5B2 is remarkably large, the wiring resistance has been further decreased.

Next, a case in which the supplementary read wire 5A as described above is substantially omitted will be described.

Figure 11:
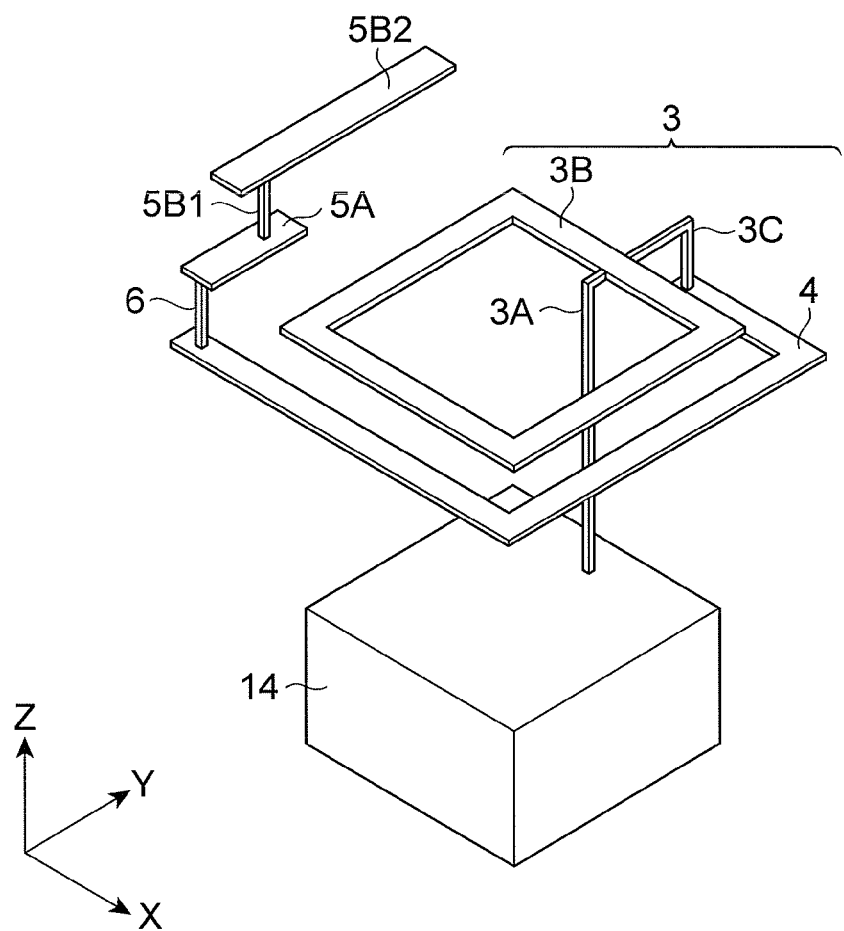

FIG. 11 is a view illustrating a relation among electrodes, wires, and the like. The structure shown in FIG. 11 is different from the structure illustrated in FIG. 4 in that the supplementary read wire 5A is not directly connected to the electrode pad and is used only for connecting the connection wire 6 and the contact electrode 5B1 with each other, and is the same as the structure illustrated in FIG. 4 in view of the other points. That is, the supplementary read wire 5A is not electrically connected to the electrode pad without passing through the read wire 5B2. Examples using such a structure will be described hereinafter.

Fourth Example

Figure 12:
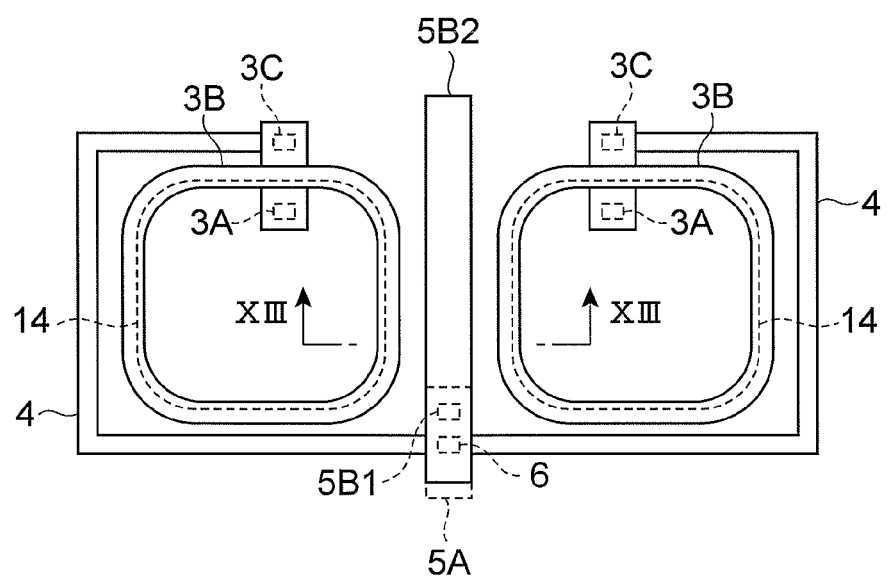
FIG. 12 is a partial plan view of a photodiode array (fourth example)
Figure 13:
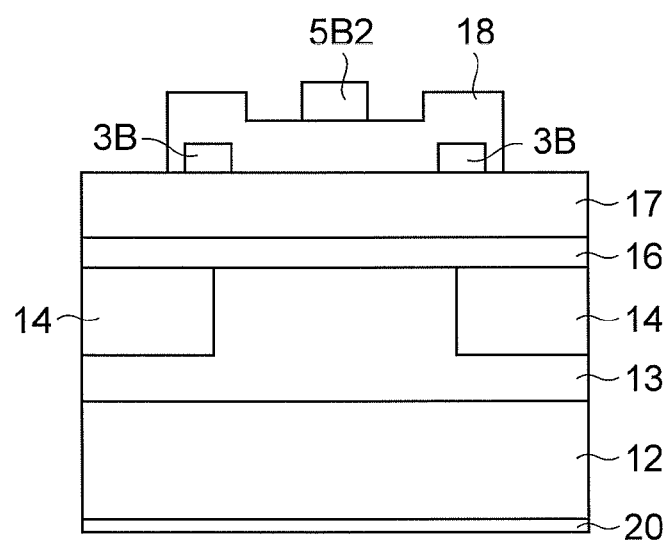
FIG. 13 is a cross-sectional view taken along line XIII-XIII of the photodiode array (fourth example) illustrated in FIG. 12.

FIG. 12 is a partial plan view of a photodiode array (fourth example), and FIG. 13 is a cross-sectional view taken along line XIII-XIII of the photodiode array (fourth example) illustrated in FIG. 12.

The structure of the fourth example corresponds to a case in which a read wire 5B2 extends between neighboring semiconductor regions 14 and the width of a read wire 5B2 is shorter than the spaced distance between neighboring surface electrodes 3B, in the structure illustrated in FIG. 11. Further, the supplementary read wire 5A has the same width as that of the read wire 5B2, and has a small part extending in parallel to the read wire 5B2 but is cut midway before reaching the electrode pad. Here, if the third insulating layer 18 does not have a sufficiently large thickness or if the third insulating layer 18 has not been subjected to a surface polishing, the surface of the third insulating layer 18 has concave and convex parts due to the shape of the surface electrode 3B thereunder, as illustrated in FIG. 13. Since the supplementary read wire 5A does not substantially exist, the surface of the third insulating layer 18 does not actually have any concave or convex part caused by the supplementary read wire 5A.

In the present example, since the read wire 5B2 extends through the upper layer, the thickness or the width can be freely designed, and it is possible to decrease the wiring resistance and decrease the time constant, thereby increasing the signal read speed.

Fifth Example

Figure 14:
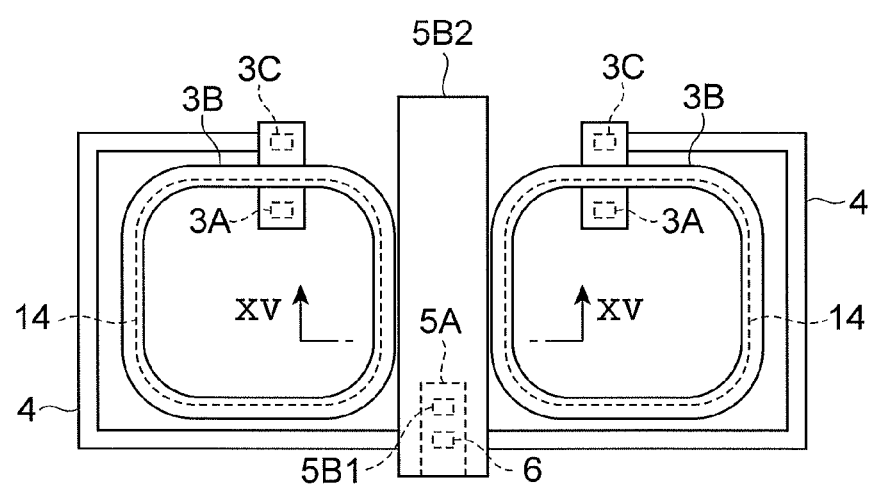
FIG. 14 is a partial plan view of a photodiode array (fifth example)
Figure 15:
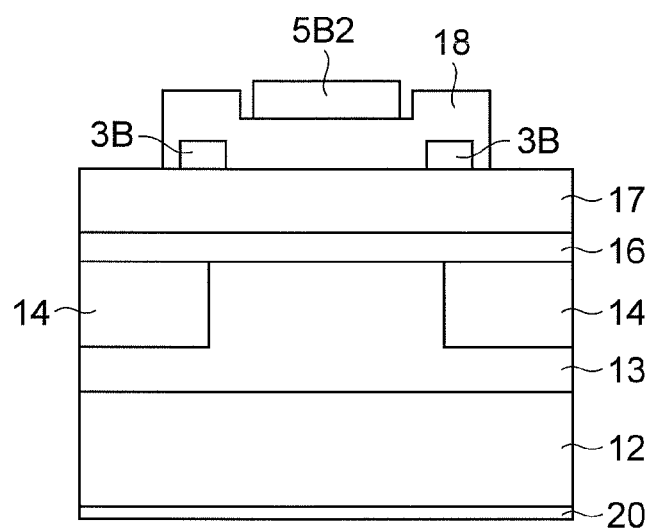
FIG. 15 is a cross-sectional view taken along line XV-XV of the photodiode array (fifth example) illustrated in FIG. 14.

FIG. 14 is a partial plan view of a photodiode array (fifth example), and FIG. 15 is a cross-sectional view taken along line XV-XV of the photodiode array (fifth example) illustrated in FIG. 14.

The structure of the fifth example corresponds to a case in which a read wire 5B2 extends between neighboring semiconductor regions 14 and the width of the read wire 5B2 is similar to the spaced distance between neighboring surface electrodes 3B, in the structure illustrated in FIG. 11. Further, a supplementary read wire 5A has the same width as that of the read wire 5B2, and has a small part extending in parallel to the read wire 5B2 but is cut midway before reaching the electrode pad. Here, if the third insulating layer 18 does not have a sufficiently large thickness or if the third insulating layer 18 has not been subjected to a surface polishing, the surface of the third insulating layer 18 has concave and convex parts due to the shape of the surface electrode 3B thereunder, as illustrated in FIG. 15. Since the supplementary read wire 5A does not substantially exist, the surface of the third insulating layer 18 does not actually have any concave or convex part caused by the supplementary read wire 5A.

In the present invention, since the width of the read wire 5B2 is large, it is possible to decrease the wiring resistance and decrease the time constant, thereby increasing the a signal read speed. Further, since the supplementary read wire 5A does not substantially exist, the third insulating layer 18 does not have any step caused by the supplementary read wire 5A, thereby making it possible to prevent occurrence of disconnection of the read wire 5B2 due to such a step.

Further, in the fourth and fifth examples described above, the surface of the third insulating layer 18 can be flattened by making the thickness of the third insulating layer 18 to be sufficiently large or by polishing the surface of the third insulating layer 18. The scope of the thickness of the third insulating layer 18 and the scope of the thickness of the surface electrode 3B, which enable the flattening, are the same as those described in the second example.

Sixth Example

Figure 16:
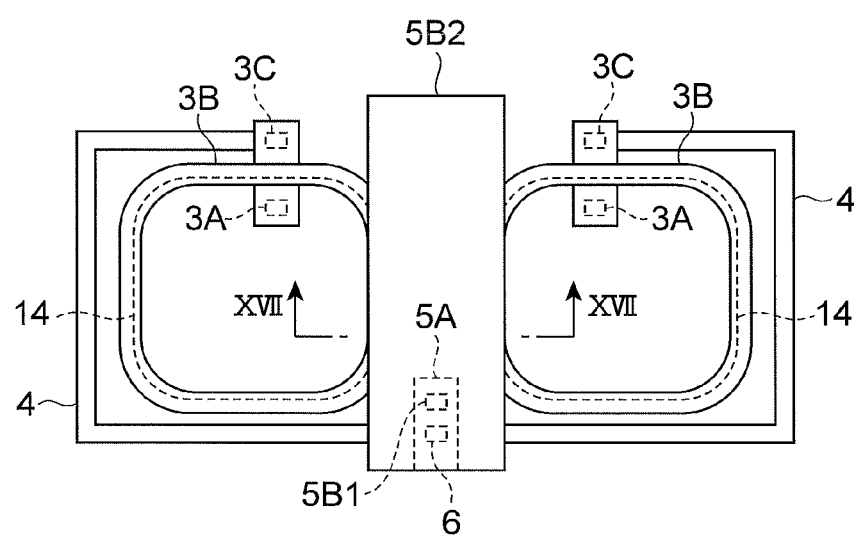
FIG. 16 is a partial plan view of a photodiode array (sixth example)
Figure 17:
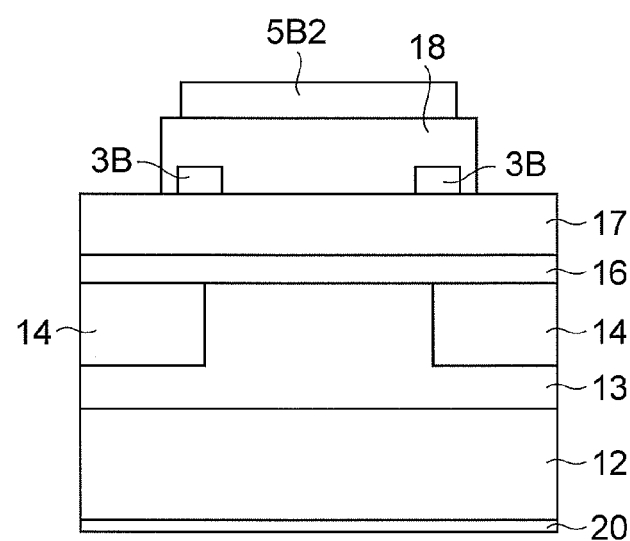
FIG. 17 is a cross-sectional view taken along line XVII-XVII of the photodiode array (sixth example) illustrated in FIG. 16.

FIG. 16 is a partial plan view of a photodiode array (sixth example), and FIG. 17 is a cross-sectional view taken along line XVII-XVII of the photodiode array (sixth example) illustrated in FIG. 16.

The structure of the sixth example corresponds to a case in which a read wire 5B2 extends between neighboring semiconductor regions 14 and the width of the read wire 5B2 is longer than the spaced distance (the minimum value of spaced distances between the outer edges) between neighboring surface electrodes 3B, in the structure illustrated in FIG. 11. The width of the read wire 5B2 is equal to or smaller than the minimum separate distance value between the inner edges of the neighboring surface electrodes 3B.

Further, a supplementary read wire 5A has the same width as that of the read wire 5B2, and has a small part extending in parallel to the read wire 5B2 but is cut midway before reaching the electrode pad. Here, since the third insulating layer 18 has a sufficiently large thickness or has been subjected to a surface polishing, the third insulating layer 18 has a flattened surface, as illustrated in FIG. 17.

In the present example, since the width of the read wire 5B2 is sufficiently large, it is possible to decrease the wiring resistance and decrease the time constant, thereby increasing the signal read speed. Further, since the supplementary read wire 5A does not substantially exist and the third insulating layer 18 has a flattened surface, the third insulating layer 18 does not have any step, thereby making it possible to prevent an occurrence of disconnection of the read wire 5B2 due to such a step.

Seventh Example

Figure 18:
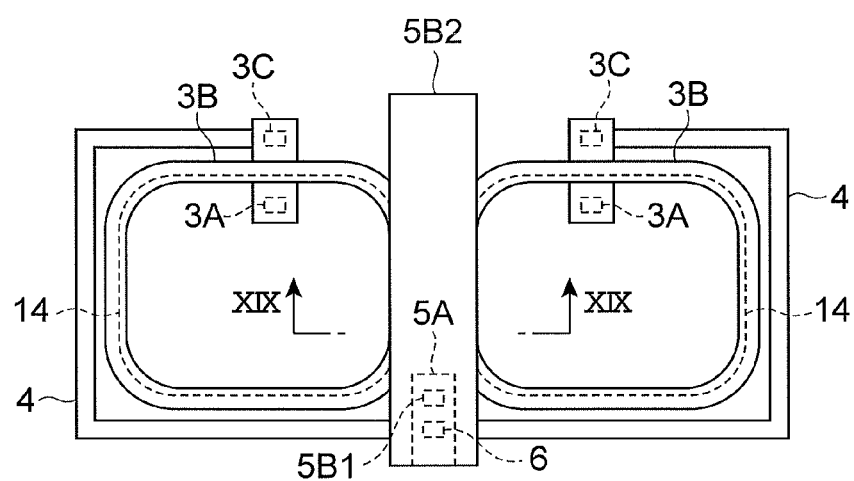
FIG. 18 is a partial plan view of a photodiode array (seventh example)
Figure 19:
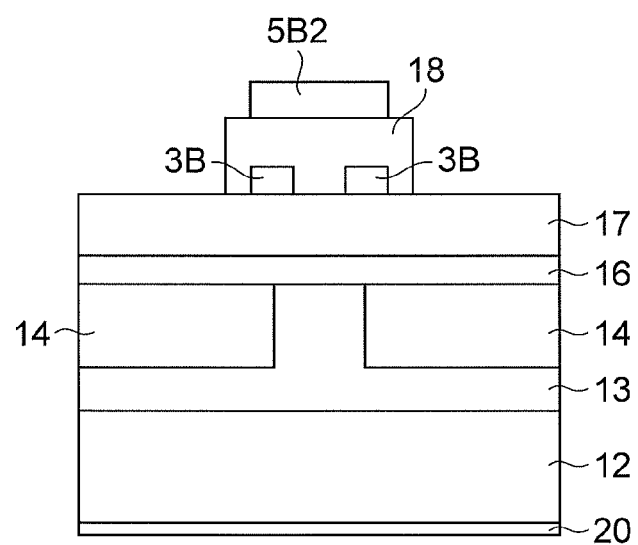
FIG. 19 is a cross-sectional view taken along line XIX-XIX of the photodiode array (seventh example) illustrated in FIG. 18.

FIG. 18 is a partial plan view of a photodiode array (seventh example), and FIG. 19 is a cross-sectional view taken along line XIX-XIX of the photodiode array (seventh example) illustrated in FIG. 18.

The structure of the seventh example corresponds to a structure in which the spaced distance of the semiconductor region 14 is reduced while reducing the width of the read wire 5B2, and the opening ratio of the photodiode is increased, in the structure of the sixth example. The other points are identical to those of the sixth example. Further, in any example, the contact electrode 5B1 may be disposed outside the region surrounded by a quenching resistor 4.

In the present example, since the width of the read wire 5B2 is sufficiently large, it is possible to decrease the wiring resistance and decrease the time constant, thereby increasing the signal read speed. Further, since a supplementary read wire 5A does not substantially exist and a third insulating layer 18 has a flattened surface, the third insulating layer 18 does not have any step, thereby making it possible to prevent an occurrence of disconnection of the read wire 5B2 due to such a step. Further, since the photodiode has an improved fill factor, it can produce an enlarged output signal.

Further, any structure described above may employ the structure illustrated in FIG. 20 as a structure of the semiconductor substrate.

FIG. 20 is a longitudinal sectional view of a photodiode array in which the structure of the substrate has been changed.

In FIG. 20, in comparison with the photodiode array described above, only changed parts are illustrated in solid lines and the others are illustrated in one-dot-chain lines.

The structure is different from the structure of Types 1 to 4 described above in that a semiconductor region 15 is disposed right below the semiconductor region 14, and the others are the same. The semiconductor region 15 has either the same conductivity type as that of the semiconductor region 14 or a conductivity type different from that of the semiconductor region 14. Structures having the same conductivity types are set as (Type 1S) to (Type 4S), and structures having different conductivity types are set as (Type 1D) to (Type 4D). Further, the impurity concentration of the semiconductor region 15 is smaller than the impurity concentration of the semiconductor region 14. Further, B (Boron) may be employed as an impurity of the p-type and P (phosphorus), As (arsenicum), or SB (stibium) may be employed as an impurity of the n-type.

Further, proper scopes of the conductivity type, the impurity concentration, and the thickness of each layer in the semiconductor structures described above are as follows.

(Type 1)
Semiconductor region 12
(Conductivity type/Impurity concentration/Thickness)
(N-type/$5 \times 10^{11}$ to $1 \times 10^{20}$ cm$^{-3}$/30 to 700 μm)
Semiconductor region 13
(Conductivity type/Impurity concentration/Thickness)
(P-type/$1 \times 10^{14}$ to $1 \times 10^{17}$ cm$^{-3}$/2 to 50 μm)
Semiconductor region 14
(Conductivity type/Impurity concentration/Thickness)
(P-type/$1 \times 10^{18}$ to $1 \times 10^{20}$ cm$^{-3}$/10 to 1000 nm)

(Type 2)
Semiconductor region 12
(Conductivity type/Impurity concentration/Thickness)
(P-type/$5 \times 10^{11}$ to $1 \times 10^{20}$ cm$^{-3}$/30 to 700 μm)
Semiconductor region 13
(Conductivity type/Impurity concentration/Thickness)
(N-type/$1 \times 10^{14}$ to $1 \times 10^{17}$ cm$^{-3}$/2 to 50 μm)
Semiconductor region 14
(Conductivity type/Impurity concentration/Thickness)
(N-type/$1 \times 10^{18}$ to $1 \times 10^{20}$ cm$^{-3}$/10 to 1000 nm)

(Type 3)
Semiconductor region 12
(Conductivity type/Impurity concentration/Thickness)
(N-type/$5 \times 10^{11}$ to $1 \times 10^{20}$ cm$^{-3}$/30 to 700 μm)
Semiconductor region 13
(Conductivity type/Impurity concentration/Thickness)
(N-type/$1 \times 10^{14}$ to $1 \times 10^{17}$ cm$^{-3}$/2 to 50 μm)
Semiconductor region 14
(Conductivity type/Impurity concentration/Thickness)
(P-type/$1 \times 10^{18}$ to $1 \times 10^{20}$ cm$^{-3}$/10 to 1000 nm)

(Type 4)
Semiconductor region 12
(Conductivity type/Impurity concentration/Thickness)
(P-type/$5 \times 10^{11}$ to $1 \times 10^{20}$ cm$^{-3}$/30 to 700 μm)
Semiconductor region 13
(Conductivity type/Impurity concentration/Thickness)
(P-type/$1 \times 10^{14}$ to $1 \times 10^{17}$ cm$^{-3}$/2 to 50 μm)
Semiconductor region 14
(Conductivity type/Impurity concentration/Thickness)
(N-type/$1 \times 10^{18}$ to $1 \times 10^{20}$ cm$^{-3}$/10 to 1000 nm)

(Type 1S)
The parameters of the semiconductor regions 12, 13, and 14 are the same as those of Type 1.
Semiconductor region 15
(Conductivity type/Impurity concentration/Thickness)
(P-type/$1 \times 10^{14}$ to $1 \times 10^{17}$ cm$^{-3}$/2 to 50 μm)

(Type 2S)
The parameters of the semiconductor regions 12, 13, and 14 are the same as those of Type 2.
Semiconductor region 15
(Conductivity type/Impurity concentration/Thickness)
(N-type/$1 \times 10^{14}$ to $1 \times 10^{17}$ cm$^{-3}$/2 to 50 μm)

(Type 3S)
The parameters of the semiconductor regions 12, 13, and 14 are the same as those of Type 3.
Semiconductor region 15
(Conductivity type/Impurity concentration/Thickness)
(P-type/$1 \times 10^{14}$ to $1 \times 10^{17}$ cm$^{-3}$/2 to 50 μm)

(Type 4S)
The parameters of the semiconductor regions 12, 13, and 14 are the same as those of Type 4.
Semiconductor region 15
(Conductivity type/Impurity concentration/Thickness)
(N-type/$1 \times 10^{14}$ to $1 \times 10^{17}$ cm$^{-3}$/2 to 50 μm)

(Type 1D)
The parameters of the semiconductor regions 12, 13, and 14 are the same as those of Type 1.
Semiconductor region 15
(Conductivity type/Impurity concentration/Thickness)
(N-type/$1 \times 10^{14}$ to $1 \times 10^{17}$ cm$^{-3}$/2 to 50 μm)

(Type 2D)
The parameters of the semiconductor regions 12, 13, and 14 are the same as those of Type 2.
Semiconductor region 15
(Conductivity type/Impurity concentration/Thickness)
(P-type/$1 \times 10^{14}$ to $1 \times 10^{17}$ cm$^{-3}$/2 to 50 μm)

(Type 3D)
The parameters of the semiconductor regions 12, 13, and 14 are the same as those of Type 3.
Semiconductor region 15
(Conductivity type/Impurity concentration/Thickness)
(N-type/$1 \times 10^{14}$ to $1 \times 10^{17}$ cm$^{-3}$/2 to 50 μm)

(Type 4D)
The parameters of the semiconductor regions 12, 13, and 14 are the same as those of Type 4.
Semiconductor region 15
(Conductivity type/Impurity concentration/Thickness)
(P-type/$1 \times 10^{14}$ to $1 \times 10^{17}$ cm$^{-3}$/2 to 50 μm)

Further, in the examples described above, the semiconductor region 12 at the lowermost part configures a semiconductor substrate having a large thickness. However, the light detecting units 10 may additionally include a semiconductor substrate below the semiconductor region 12, and in this case, the semiconductor region 12 has a thickness thinner than the additional semiconductor substrate.

Further, the semiconductor region 13 may be formed on the semiconductor region 12 by an epitaxial growth method, or may be formed by impurity diffusion in or ion implantation into the substrate. The semiconductor regions 14 and 15 may be formed by impurity diffusion in or ion implantation into the semiconductor region 13.

Figure 21:
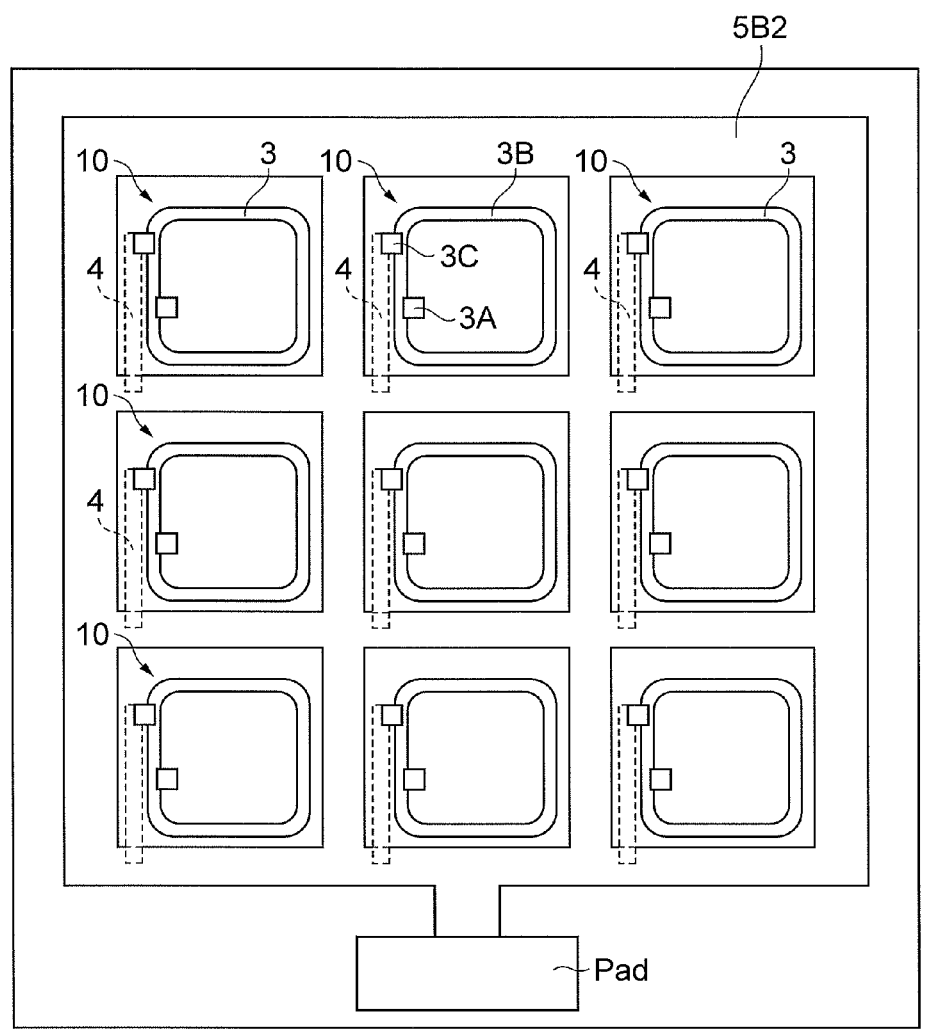
FIG. 21 is a plan view of a photodiode array.

FIG. 21 is a plan view of the photodiode array. The present example has an electrode pattern with a structure of the type as illustrated in FIG. 3. On the surface, a grid-shaped read electrode 5B2 is formed, and a light detecting unit 10 is positioned in each opening of the grid.

Each light detecting unit 10 has a connection electrode 3 connected to the semiconductor region 14 (see FIG. 3), and the connection electrode 3 is connected to the read wire 5B2 through the quenching resistor 4. The structure of the longitudinal cross section along the path of the carrier progression in the photodiode array is as illustrated in FIG. 2. However, it is possible to adopt the structures of Types 1 to 4 (Types 1S to 4S and 1D to 4D) described above. Further, the read wire 5B2 in the upper layer is indispensable, but the supplementary read wire 5A in the lower layer may be either used or omitted. That is, the structures of the first to seventh examples described above can be applied as the structures of the read wire 5B2 and the supplementary read wire 5A.

Further, a plurality of light detecting units 10 may be disposed in one opening of the read wire 5B2.

Figure 22:
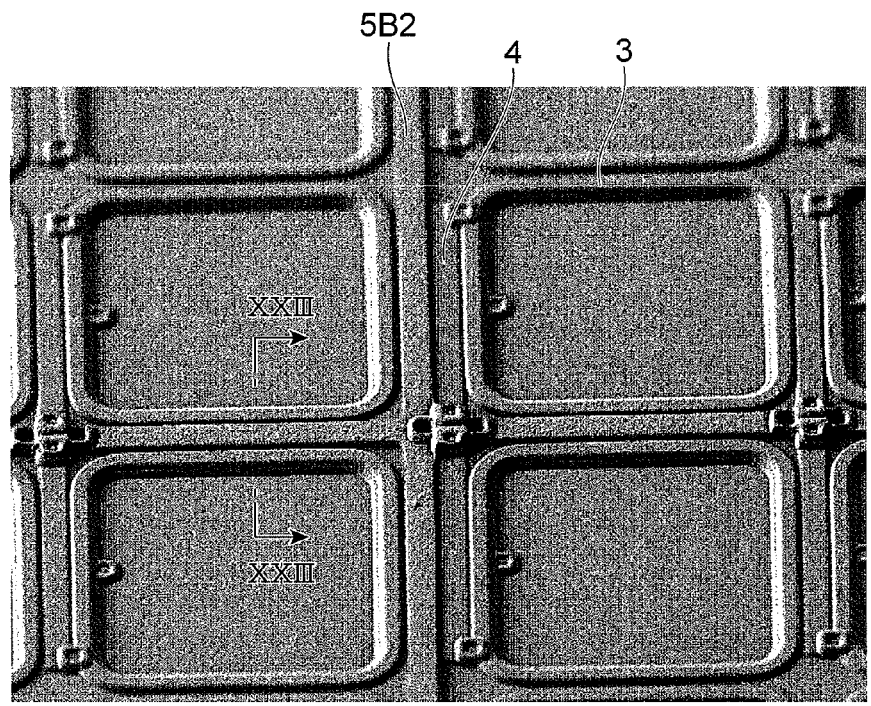
FIG. 22 is a diagram illustrating an SEM photograph of a surface of a photodiode array.

FIG. 22 is a diagram illustrating an SEM (scanning electron microscope) photograph of a surface of such a photodiode array as described above, and FIG. 23 is a diagram illustrating an SEM photograph of a cross section (cross-sectional view taken along line XXIII-XXIII) of the photodiode array. Further, the present example shows the structure of the fifth example, and the supplementary read electrode 5A is not substantially used.

Figure 23:
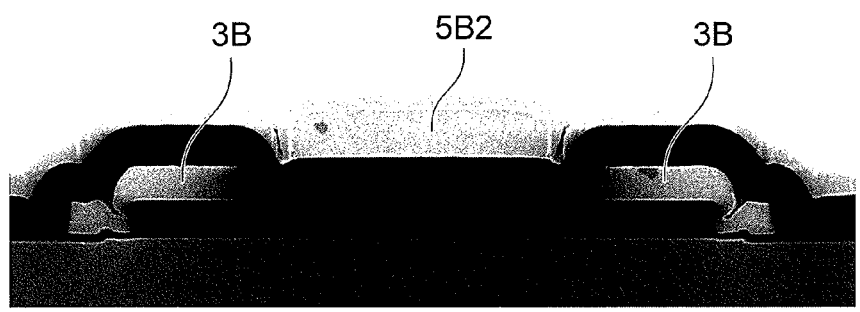
FIG. 23 is a diagram illustrating an SEM photograph of a cross section of a photodiode array.

In FIG. 22, depending on the change of the surface shape of the third insulating layer 18, it is observed that the quenching resistor 4 connected to the surface electrode 3B exists and the read wire 5B2 extends in parallel to the quenching resistor 4. In FIG. 23, it is illustrated that the read electrode 5B2 exists in a layer higher than the surface electrode 3B.

Figure 24:
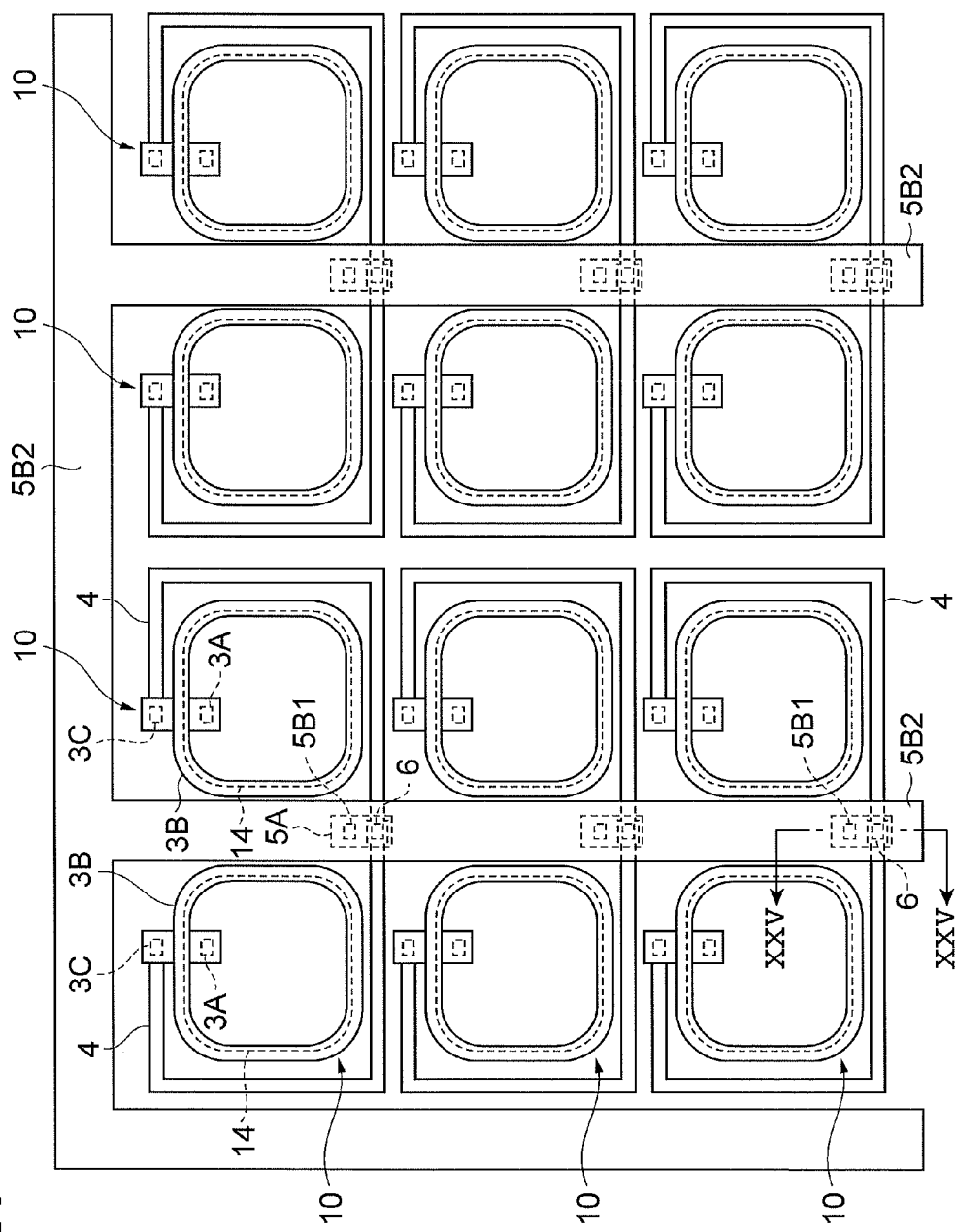
FIG. 24 is a plan view of a part of a photodiode array.

FIG. 24 is a plan view of a part of a photodiode array. The present example has an electrode pattern of the structure of the type illustrated in FIG. 4. On the surface, a grid-shaped read electrode 5B2 having rectangular openings is formed, and a plurality of light detecting units 10 are positioned in each opening of the grid. The present structure corresponds to the photodiode array according to the second example.

Each of the light detecting units 10 has an avalanche photodiode having a semiconductor region 14 that outputs a carrier, and the surface electrode 3B is electrically connected to the semiconductor region 14 and surrounds the semiconductor region 14 along the outer edge thereof. The surface electrode 3B and the read wire 5B2 are connected with each other through the quenching resistor 4.

Two light detecting units 10 adjacent to each other in the transverse direction are connected to one read wire 5B2 extending in the longitudinal direction through a common connection wire (contact electrode) 6, and these light detecting units 10 have line-symmetric structures with respect to the longitudinal central axis of a corresponding read wire 5B2. This structure can reduce the number of the read wires 5B2.

Figure 25:
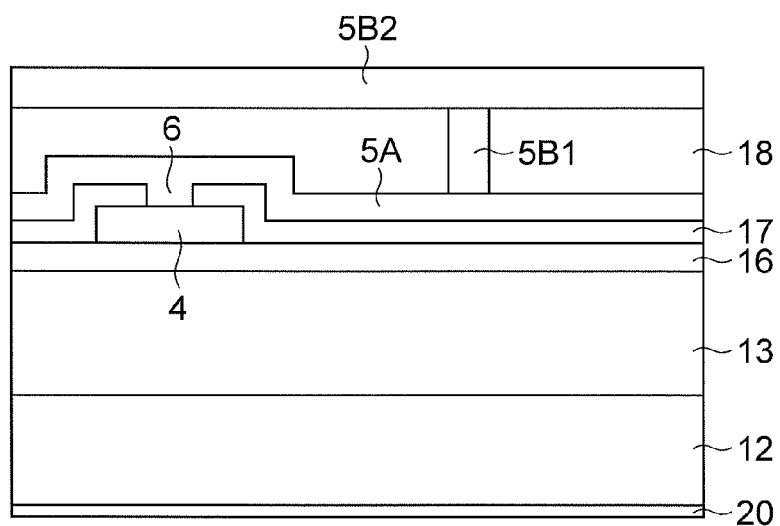
FIG. 25 is a cross-sectional view taken along line XXV-XXV of the photodiode array (second example) illustrated in FIG. 24.

FIG. 25 is a cross-sectional view taken along line XXV-XXV of the photodiode array according to the second example illustrated in FIG. 24.

The semiconductor region 13 is formed on the semiconductor layer 12 and the first insulating layer 16 is formed on the semiconductor region 13. The quenching resistor 4 is formed on the first insulating layer 16 and the second insulating layer 17 is formed thereon. The supplementary read wire 5A is provided on the second insulating layer 17 and through the contact hole of the second insulating layer 17, and the third insulating layer 18 is formed on the supplementary read wire 5A. The contact electrode 5B1 is provided in the contact hole formed through the third insulating layer 18, and physically and electrically connects the supplementary read wire 5A in the lower layer and the read wire 5B2 in the upper layer with each other.

Further, in the case where the contact electrode 5B1 is disposed at the terminal position of the terminal of the supplementary read wire 5A and the supplementary read wire 5A of the output side is thus omitted in the present example, the present example corresponds to the photodiode array of the fifth example described above. Further, the wire connection structure of the present example can be applied to any structure of the first to seventh examples.

Further, when the supplementary read electrode 5A is not included, the contact electrode 5B1 may be disposed immediately above the quenching resistor 4, so as to directly connect the quenching resistor 4 and the read wire 5B2 with each other by the contact electrode 5B1. In this manner, it is possible to employ a structure in which the supplementary read wire 5A is completely omitted.

In any structure and any example, the photodiode array described above includes an insulating layer 18 formed on the quenching resistor 4, the read wire 5B2 is electrically connected to the quenching resistor 4 through the contact hole provided in the insulating layer 18, and the quenching resistor 4 and the electrode pad "Pad" are electrically connected with each other.

Next, materials of the photodiode array will be described below.

A material of the semiconductor regions 12, 13, and 14 that configure the semiconductor substrate is Si as described above and contains a desired impurity. Materials of each of the insulating layers 16, 17, and 18 are $SiO_2$ or silicon nitride. Materials of the connection electrode 3, the connection wire 6, the supplementary connection wire 5A, the connection wire 5B (including the read wire 5B2 and the contact electrode) and the electrode pad "Pad" are metals, preferably metals such as Al, Cu, Au, Cr, Ag, or Fe, or alloys including two or more of these. Materials of the quenching resistor 4 are materials with a resistance higher than that of the read wire 5B2, for example, polysilicon, SiCr, NiCr, or TaNi.

Further, the SEM photograph described above corresponds to an example which uses $SiO_2$ as a material of the insulating layers 16, 17, and 18, uses Al as a material of the connection electrode 3, the connection wire 6, the supplementary connection wire 5A, the connection wire 5B (including the read wire 5B2 and the contact electrode), and the electrode pad "Pad", and uses polysilicon as a material of the quenching resistor 4.

Next, a method of manufacturing the photodiode array described above will be described with reference to FIG. 2 again.

First, the semiconductor region 13 is formed on the semiconductor region (semiconductor substrate) 12 by an epitaxial growth method, an impurity diffusion method, or an ion implantation method. Further, it is proper that the semiconductor region 12 is a (100)Si semiconductor substrate formed by a CZ method or an FZ method. However, a semiconductor substrate having other plain orientations may be used. When the Si epitaxial growth method is used, for example, gaseous silicon tetrachloride ($SiCl_4$) and trichlorosilane ($SiHCl_3$) are used as raw materials, and these gases are allowed to flow on the substrate surface at the growth temperature of 1200° C. In case of the impurity diffusion method, impurities corresponding to the conductivity type of the semiconductor region 13 are diffused in a gaseous or solid phase into the semiconductor region 12. In case of the ion implantation method, impurities corresponding to the conductivity type of the semiconductor region 13 are ion-implanted into the semiconductor region 12.

Next, the semiconductor region 14 is formed on a region at the surface side of the semiconductor region 13. For this formation, the impurity diffusion method or the ion implantation method can be used. For example, in the diffusion method, when diborane ($B_2H_6$) is used as a raw material of the impurities, the diffusion temperature can be set to 1200° C. In the formation of the semiconductor region 14, a resist pattern having openings on the semiconductor region 13 is first formed by a photolithography technique. Then, impurities are added into the resist pattern by using the resist pattern as a mask. Further, after the grid-shaped wiring pattern 5B2 is formed, the addition of the impurity may be performed by an ion implantation method through the insulating layer 16 using the wiring pattern 5B2 as a mask.

Next, the insulating layer 16 is formed on the semiconductor substrate. The insulating layer 16 may be formed by using an Si thermal oxidation method. The oxidation temperature is 1000° C., for example. As a result, the surfaces of the semiconductor regions 13 and 14 are oxidized, and the insulating layer 16 including $SiO_2$ is then formed. The CVD method can be used in the formation of the insulating layer 16.

Next, a mask is formed at a desired position in the insulating layer 16 by using resist patterning by a photolithography technique, a resistive material is deposited in the opening of the resist by using the mask, the quenching resistor 4 is formed in the opening, and the resist is then removed. The resistive material can be deposited by a sputtering method which uses the resistive material as a target. For example, a polysilicon quenching resistor 4 may be formed using silicon as the resistive material.

Thereafter, the insulating layer 17 is formed on the insulating layer 16. The insulating layer 17 can be formed using a sputtering method or a plasma CVD method. In the case of using the plasma CVD method, tetraethoxysilane (TEOS) and oxygen gases are used as raw material gases, and the insulating layer 17 is grown in a state in which the growth temperature is set to about 200° C. The thickness of the insulating layer 17 is preferably set to a thickness in which the surface thereof is flattened, and is preferably larger than the height from the surface of the insulating layer 16 to the upper surface of the wiring pattern 5B2. Accordingly, the insulating layer 17 made of $SiO_2$ is formed.

Next, contact holes are formed through the insulating layers 16 and 17 at positions above the semiconductor region 14. In the formation of the contact holes, a resist pattern having openings on the insulating layer 17 is first formed by a photolithography technique, and the insulating layers 16 and 17 are then etched using the resist pattern as a mask. As an etching method, not only a dry etching method but also a wet etching using etching solution including an HF solution can be used.

Thereafter, a mask is formed using resist patterning by a photolithography technique at a desired position on the insulating layer 17, deposition is performed in openings of the resist by using the mask, the first contact electrode 3A, the surface electrode 3B, the second contact electrode 3C, the connection wire 6, and the supplementary read electrode 5A are formed at the same time in the openings by a vapor deposition method, and the resist is then removed after these are formed. Although aluminum is used as a vapor deposition material in the present example, a sputtering method or the like may be used.

Next, the insulating layer 18 is formed on the insulating layer 17. The method of forming the insulating layer 18 is the same as the method of forming the insulating layer 17.

Subsequently, a mask is formed at a desired position of the insulating layer 18 by using resist patterning according to a photolithography technique, a contact hole is formed by etching the insulating layer 18 by using the mask, and the resist is then removed after the formation of the contact hole. As an etching method at the time of the formation of the contact hole, not only a dry etching method but also a wet etching using an etching solution including an HF solution can be used. The contact electrode 5B1 is formed in the contact hole and simultaneously, the read wire 5B2 successive to the contact electrode 5B1 is formed.

In the formation of the contact electrode 5B1 and the read wire 5B2, a mask is first formed at a desired position of the insulating layer 18 by using resist patterning according to a photolithography technique, and the contact electrode 5B1 and the read wire 5B2 are then deposited in openings of the mask. As a deposition method, a deposition method or a sputtering method can be used.

Further, in the case of manufacturing a light detecting unit with the structure illustrated in FIG. 20, the semiconductor region 15 may be formed at the surface side of the semiconductor region 13 by using an impurity diffusion method or an ion implantation method, before the formation of the semiconductor region 14. In the case of an impurity diffusion method, gaseous or solid impurities corresponding to the conductivity type of the semiconductor region 15 are diffused into the semiconductor region 13. In the case of an ion implantation method, impurities corresponding to the conductivity type of the semiconductor region 15 are ion-implanted into the semiconductor region 13.

Further, when the electrode pad "Pad" illustrated in FIG. 1 is formed on the second insulating layer 17, it can be simultaneously formed together with the surface electrode 3B by resist patterning. Further, when the electrode pad "Pad" is formed on the third insulating layer 18 and the supplementary read wire 5A is then connected to the electrode pad "Pad", a contact hole for connecting the supplementary read wire 5A and the electrode pad "Pad" with each other may be first formed through the third insulating layer 18 and the contact electrode and the electrode pad "Pad" may be then simultaneously formed in the contact hole at the same time with formation of the read wire 5B2.

Further, although the surface shape of the quenching resistor 4 is annular in the embodiments described above, the surface shape may be a shape of a part of a ring or a spiral shape.

Next, an effect in a case where a photodiode array with the structure of the fifth example (FIGS. 14 and 15) described above is experimentally produced will be described.

The manufacture condition is as follows.
(1) Structure
(1-1) Semiconductor region 12:
Conductivity type: N-type (Impurity: Sb (Stibium))
Impurity concentration: $5.0 \times 10^{11}$ $cm^{-3}$
Thickness: 650 μm
(1-2) Semiconductor region 13:
Conductivity type: P-type (Impurity: B (Boron))
Impurity concentration: $1.0 \times 10^{14}$ $cm^{-3}$
Thickness: 30 μm
(1-3) Semiconductor region 14:
Conductivity type: P-type (Impurity: B (Boron))
Impurity concentration: $1.0 \times 10^{18}$ $cm^{-3}$
Thickness: 1000 nm
(1-4) Insulating layer 16: $SiO_2$ (Thickness: 1000 nm)
(1-5) Insulating layer 17: $SiO_2$ (Thickness: 2000 nm)
(1-6) Insulating layer 18: $SiO_2$ (Thickness: 2000 nm)
(1-7) Connection electrode 3: (Aluminum (Al))
(1-8) Quenching resistor 4 (Polysilicon)
Shape: Shape as illustrated in FIG. 21
Thickness: 500 nm
Width: 2 μm
Length: 100 μm
Resistance value: 500 kΩ
(1-9) Light detecting unit 10:
Dimension S of one light detecting unit 10: 2025 μm$^2$
Spacing X between centers of neighboring light detecting units 10: 50 μm.

Number of photodiodes in light receiving area (100 units in the X-axis direction×100 units in the Y-axis direction)

Dimension of light receiving area in the X-axis direction: 5 mm

Dimension of light receiving area in the Y-axis direction: 5 mm (1-10) Read wire 5B2

Width: 5 μm

Number of wires in the X-axis direction: 101 units

Number of wires in the Y-axis direction: 101 units

Number of light detecting units 10 in one opening: 1

(2) Manufacture Condition

Semiconductor region 12: CZ method ((001)Si semiconductor substrate)

Semiconductor region 13: Si epitaxial growth method (Raw material: Gaseous silicon tetrachloride (SiCl$_4$), Trichlorosilane (SiHCl$_3$), Growth temperature 1200° C.)

Semiconductor region 14: Impurity thermal diffusion method (Impurity raw material: Diborane (B$_2$H$_6$), Diffusion temperature 1200° C.)

Insulating layer 16: (Si thermal oxidation method: Oxidation temperature (1000° C.))

Quenching resistor 4: Sputtering method (Target material: Si)

Insulating layer 17: (Plasma CVD method: Raw material gas (Tetraethoxysilane (TEOS) and Oxygen gas): Growth temperature (200° C.))

First contact electrode 3A, Surface electrode 3B, Second contact electrode 3C, Connection wire 6, Supplementary read wire 5A, Electrode pad "Pad": Evaporation method (Material: Aluminum)

Insulating layer 18: (Plasma CVD method: Raw material gas (Tetraethoxysilane (TEOS) and Oxygen gas): Growth temperature (200° C.))

Contact electrode 5B1, Read wire 5B2: Evaporation method (Material: Aluminum)

Characteristics of a photodiode array according to an embodiment have been evaluated as follows.

Figure 26:
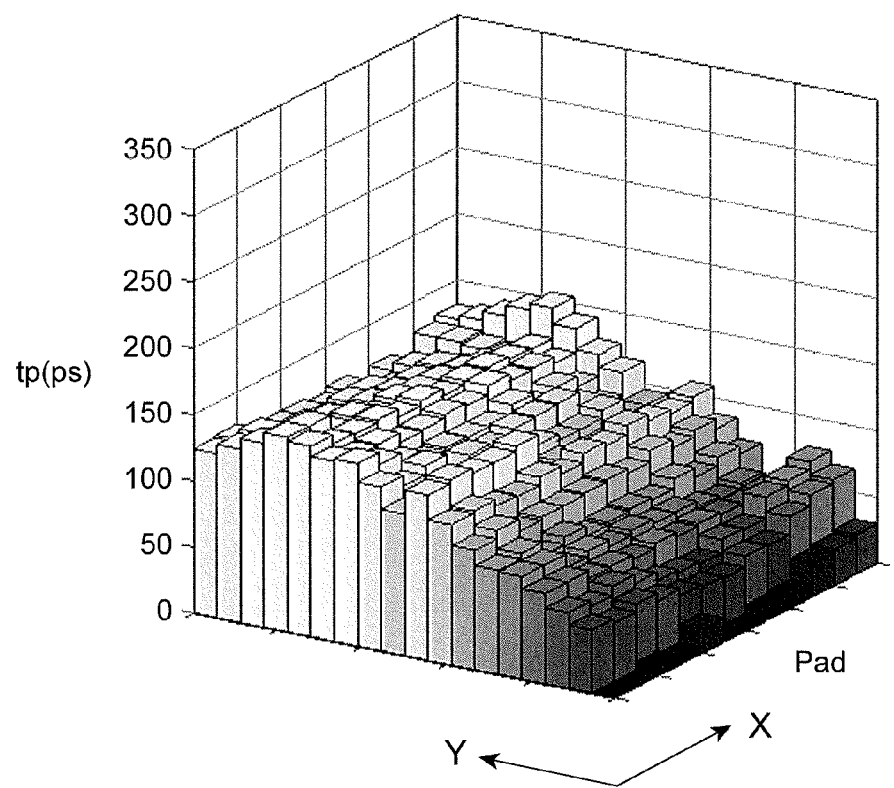
FIG. 26 is a graph (embodiment) illustrating a difference tp (ps) between a distance from a photodiode to an electrode pad and a reference of a signal transfer time.

FIG. 26 is a graph (embodiment) illustrating a distance from each photodiode (pixel) as a reference point to the electrode pad and a difference tp (ps) from the reference of the signal transfer time of a carrier. The time difference tp is a transfer time from a reference time point. Five photodiodes are arranged around each photodiode serving as a reference point, the number of reference points in the X-axis direction is 12, and the number of reference points in the Y-axis direction is 18. In the graph, an average value of the photodiode outputs around each reference point is illustrated as one unit of data.

A chip of a photodiode has dimensions of 5 mm×5 mm, the foremost position in the graph is set as the origin of the XY plane, 100 photodiodes are arranged in the X-axis direction of a light receiving area, and 100 photodiodes are arranged in the Y-axis direction thereof. The electrode pad "Pad" is provided at a position of "Pad" existing on the right of the graph.

The difference tp (ps) of the signal transfer time from each photodiode to the electrode pad tends to be longer as it goes farther from the electrode pad "Pad". However, the time difference tp is as short as 160 ps or less in total and has small in-plane dispersion.

Figure 27:
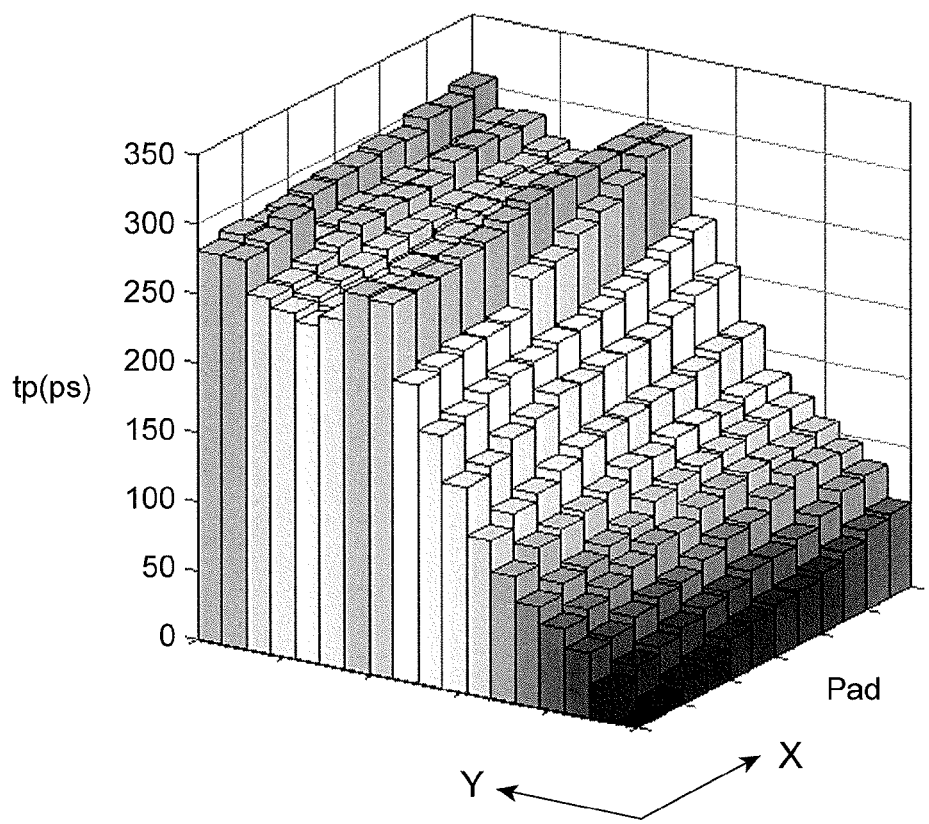
FIG. 27 is a graph (comparative example) illustrating a difference tp (ps) between a distance from a photodiode to an electrode pad and a reference of the signal transfer time.

FIG. 27 is a graph (comparative example) illustrating a distance from each photodiode to the electrode pad and a difference tp (ps) from the reference of the signal transfer time of a carrier. The comparative example corresponds to an example in which only the supplementary read wire 5A in the lower layer is used for the signal transfer and the read wire 5B2 in the upper layer is not formed in the first example described above. The width of one supplementary read wire 5A in the comparative example is 2 μm.

The difference tp (ps) of the signal transfer time from each photodiode to the electrode pad tends to be longer as it goes farther from the electrode pad "Pad". However, a majority of the time difference tp exceeds 160 ps, the maximum thereof exceeds 300 ps, and the in-plane dispersion is large.

Figure 28:
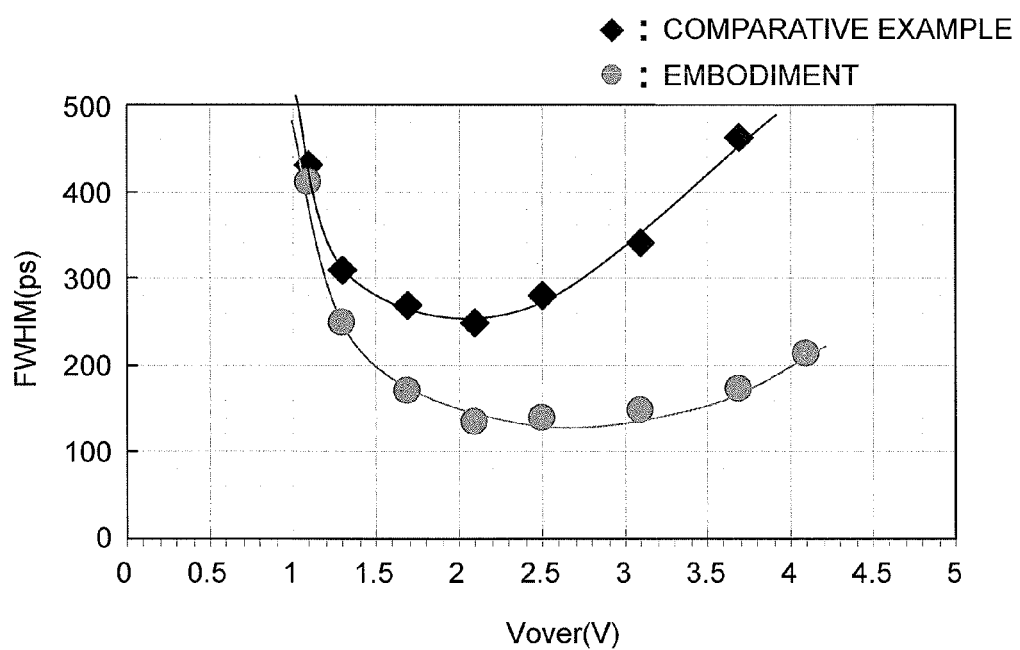
FIG. 28 is a graph illustrating a relation between a voltage $V_{over}$ and FWHM (ps)
Figure 29:
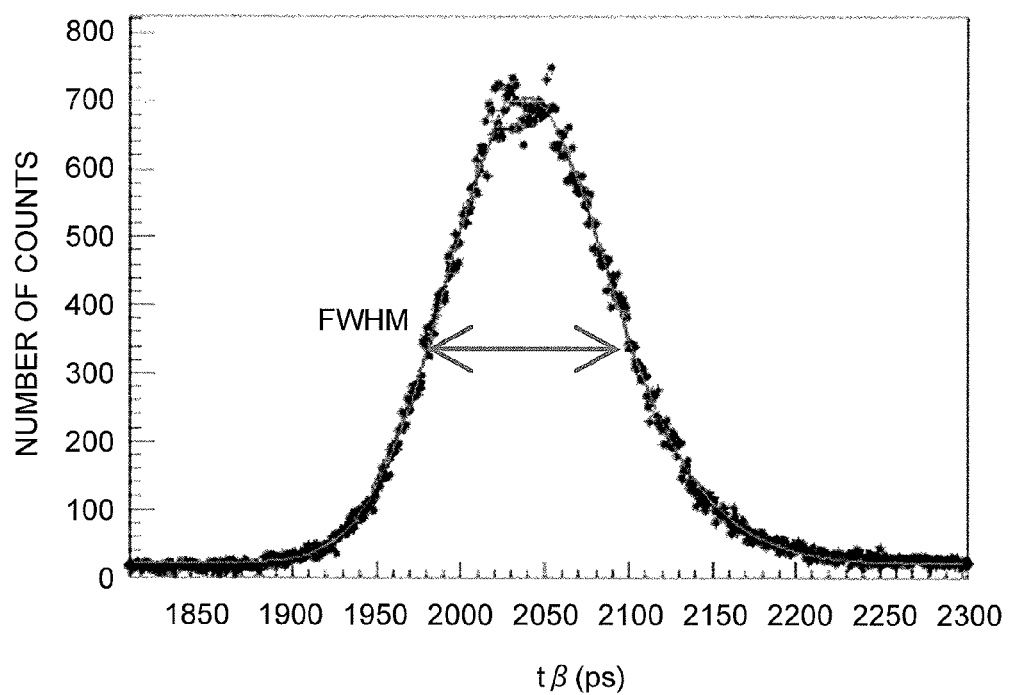
FIG. 29 is a graph illustrating a relation between a time tβ (ps) and the number of counts.

FIG. 28 is a graph illustrating a relation between a voltage $V_{over}$ and FWHM (ps) indicating the dispersion of the output pulse arrival time, and FIG. 29 is a graph illustrating a relation between an arrival time tβ (ps) and the number of counts.

In order to operate a photodiode in the Geiger mode, a reverse bias voltage (70+$V_{over}$) larger by a voltage $V_{over}$ than a breakdown voltage (70 V) of the photodiode is applied to each photodiode. In the case where the excess voltage $V_{over}$ has a value in a range of 1.5 to 4 V (reverse bias voltage=71.5 V to 74 V), a full width at half maximum (FWHM) has a value of 200 ps or less and decreases up to the minimum of 130 ps in the embodiment, while FWHM has a value of 220 ps or more in the comparative example. Further, the method of measuring FWHM is as follows.

First, a laser beam is irradiated on the entire surface of each photodiode array. Then, a plurality of pulse signals corresponding to the photon incidence are output from each photodiode. Since the photodiodes are distributed in a plane, even when laser beams enter respective photodiodes at the same time, the laser beams reach the electro pad with distributed time differences. FIG. 29 is a histogram graph showing the number of counts (the number of pulses) of pulse signals per a time tβ from a laser beam output timing to a time point when a carrier arrives at the electrode pad. The number of pulses around an arrival time tβ of 2040 (ps) is the largest, and the arrival time has a normal distribution with this arrival time as the peak. The smaller the FWHM of the graph is, the smaller the irregularity of the arrival time is.

It is noted that, in the photodiode array according to the embodiment, since FWHM is sufficiently small, the dispersion of the arrival time tβ in the plane is sufficiently suppressed compared to the comparative example.

Further, the graphs of FIGS. 26 and 27 can be obtained using methods of FIGS. 30 and 31 described below.

Figure 30:
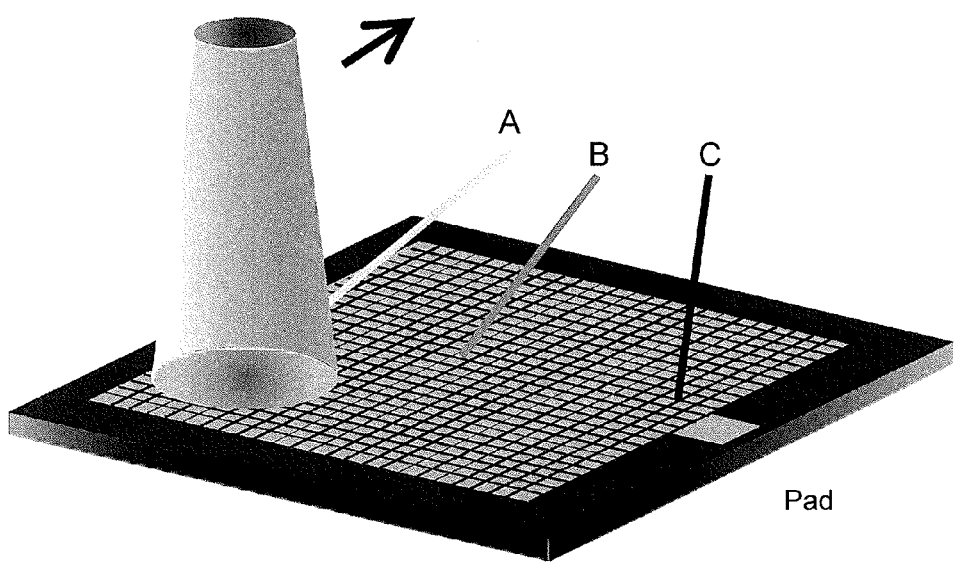
FIG. 30 is a diagram illustrating laser beam irradiation.
Figure 31:
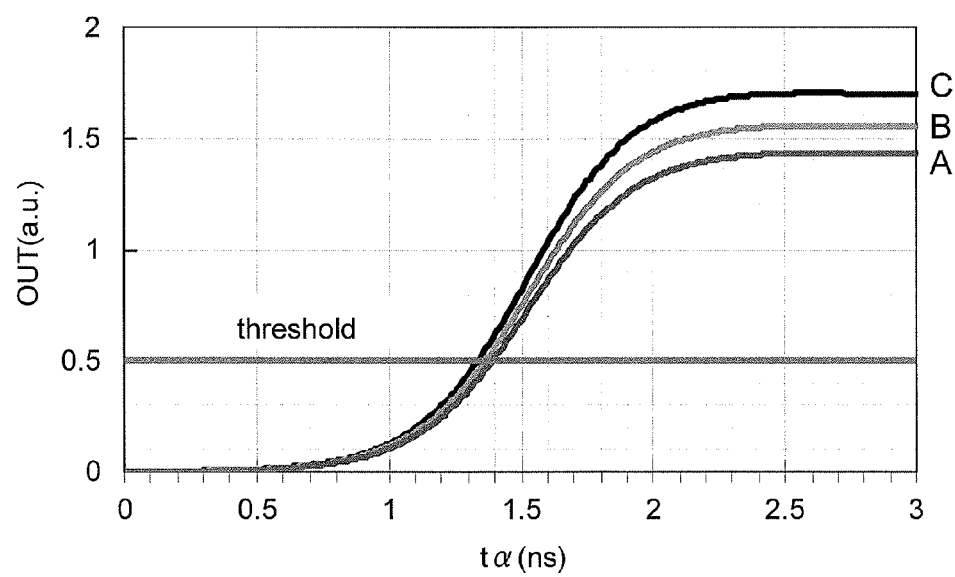
FIG. 31 is a graph illustrating a relation between a time tα (ns) and an output OUT (a.u.).

FIG. 30 is a diagram for describing laser beam irradiation, and FIG. 31 is a graph (simulation) illustrating a relation between a time tα (ns) from a laser beam output timing to a time when a carrier reaches an electrode pad and an output OUT (a.u.).

As illustrated in FIG. 30, a laser beam with a diameter of 1 mm is irradiated onto photodiode groups according to an embodiment, which exist at a remote position A, an intermediate position B, and a close position C from the electrode pad, and the laser beam is irradiated in a lateral direction (the X-axis direction) as indicated by an arrow in the drawing. Average values of outputs from the remote position A, the intermediate position B, and the close position C after the irradiation are shown in the graph of FIG. 31.

In this case, as illustrated in FIG. 31, the output OUT (a.u.) illustrating an output pulse voltage increases accompanied with the increase of the time tα (ns) and is saturated to a certain value when tα=2.5 ns or larger. The ascending time tα in which the threshold value (threshold) of the output OUT=0.5 ns or larger is 1.4 ns.

FIGS. 26 and 27 are graphs obtained by actually measuring an output pulse corresponding to the simulation diagram of FIG. 31 and mapping a time delay of a pulse at each laser irradiation position with reference to the time tα at the position C closest from the pad. Further, the mapping has been performed using the time tα at the threshold value.

As described above, a photodiode array according to the embodiments described above corresponds to a photodiode array including a plurality of light detecting units having avalanche photodiodes that operate in the Geiger mode, wherein each of the light detecting units 10 includes an avalanche photodiode PD that has a semiconductor region 14 outputting a carrier, a surface electrode 3B that is electrically connected to the semiconductor region 14 and surrounds the semiconductor region 14 along an outer edge thereof, and a quenching resistor 4 that connects the surface electrode 3B and a read wire 5B2 with each other. When a plane including the surface of the semiconductor region 14 is set to a reference plane, the distance tb from the reference plane to the read wire 5B2 is larger than the distance ta from the reference plane to the surface electrode 3B, and the read wire 5B2 is positioned between neighboring avalanche photodiodes PD (the semiconductor region 14).

A carrier generated in response to an incidence of light to the semiconductor region 14 reaches the electrode pad "Pad" sequentially through the surface electrode 3B, the quenching resistor 4, and the read wire 5B2. Since the read wire 5B2 is formed on a layer higher than the surface electrode 3B, the spatial restriction due to the surface electrode 3B is removed, so as to allow the width of the read wire 5B2 or the like to be increased. As a result, it is possible to decrease the time constant, and thereby increase the signal read speed.

Further, in view of the photodiode array described above in a direction perpendicular to the reference plane, the read wire 5B2 overlaps with a part of the surface electrode 3B (Third, Sixth, and Seventh Examples). In this case, since the region in which the read wire 5B2 is formed uses a region on the surface electrode 3B, which corresponds to a dead space with respect to the light incidence, it is possible to increase the dimensions of the read wire 5B2 without decreasing the fill factor of the photodiode, and thereby decrease the resistance value.

Further, the photodiode array described above includes the first insulating layer 17 formed on the quenching resistor 4, the supplementary read wire 5A electrically connected to the quenching resistor 4 through a contact hole formed through the first insulating layer 17, and the second insulating layer 18 formed on the supplementary read wire 5A. The read wire 5B2 is electrically connected to the supplementary read wire 5A through a contact hole formed through the second insulating layer 18, extends in parallel to the supplementary read wire 5A, and is connected to the electrode pad "Pad" together with the supplementary read wire 5A (First, Second, and Third Examples).

A resistance value from the photodiode to the electrode pad "Pad" can be reduced by using two read wires.

Further, the photodiode array described above includes the insulating layer 18 formed on the quenching resistor 4. The read wire 5B2 is electrically connected to the quenching resistor 4 through the contact hole formed through the insulating layer 18 and electrically connects the quenching resistor 4 and the electrode pad "Pad" with each other (First to Seventh Examples). Further, it is not indispensable for the supplementary read wire 5A to be directly connected to the electrode pad (Fourth to Seventh Examples). In such a case, the design freedom of the read wire 5B2 increases, and it is possible to decrease the time constant, so as to increase the signal read speed.

Further, it is proper that the resistance value of the quenching resistor 4 has a value of 100 to 1000 kΩ. The lower the resistance value of the wire from the semiconductor region 14 of the photodiode to the electrode pad, the better. However, the resistance preferably has a value equal to or lower than 20Ω, and more preferably, has a value equal to or lower than 5Ω.

What is claimed is:

1. A photodiode array comprising:
   a plurality of light detecting units having avalanche photodiodes operating in a Geiger mode,
   wherein each of the light detecting units comprises:
   an avalanche photodiode having a semiconductor region that outputs a carrier;
   a surface electrode that is electrically connected to the semiconductor region and surrounds the semiconductor region along an outer edge thereof; and
   a quenching resistor that connects the surface electrode and a read wire with each other,
   when a plane including a surface of the semiconductor region is set as a reference plane, a distance from the reference plane to the read wire is larger than a distance from the reference plane to the surface electrode, and
   the read wire is positioned between neighboring avalanche photodiodes.

2. The photodiode array according to claim 1, wherein, in view in a direction perpendicular to the reference plane, the read wire overlaps with a part of the surface electrode.

3. The photodiode array according to claim 1, further comprising:
   a first insulating layer formed on the quenching resistor;
   a supplementary read wire electrically connected to the quenching resistor through a contact hole formed through the first insulating layer; and
   a second insulating layer formed on the supplementary read wire,
   wherein the read wire is electrically connected to the supplementary read wire through a contact hole formed through the second insulating layer, extends in parallel to the supplementary read wire, and is connected to an electrode pad together with the supplementary read wire.

4. The photodiode array according to claim 1, further comprising an insulating layer formed on the quenching resistor,
   wherein the read wire is electrically connected to the quenching resistor through a contact hole formed through the insulating layer and electrically connects the quenching resistor and an electrode pad with each other.

* * * * *